(12) United States Patent
Bassi et al.

(10) Patent No.: US 7,933,756 B2
(45) Date of Patent: Apr. 26, 2011

(54) MULTI-REPRESENTATIONAL MODEL HAVING TWO OR MORE MODELS OF A MECHANICAL OBJECT

(75) Inventors: Gian Paolo Bassi, San Jose, CA (US); Attilio Rimoldi, Mozzate (IT)

(73) Assignee: Riwebb Incorporated, San Jose, CA (US)

( * ) Notice: Subject to any disclaimer, the term of this patent is extended or adjusted under 35 U.S.C. 154(b) by 562 days.

(21) Appl. No.: 12/035,126

(22) Filed: Feb. 21, 2008

(65) Prior Publication Data

US 2008/0221840 A1  Sep. 11, 2008

Related U.S. Application Data

(60) Provisional application No. 60/905,652, filed on Mar. 7, 2007.

(51) Int. Cl.
*G06F 9/455* (2006.01)
(52) U.S. Cl. ............................... 703/7; 700/98; 700/182
(58) Field of Classification Search .................. 703/1, 2, 703/7; 700/98, 182; 704/1; 345/419, 420
See application file for complete search history.

(56) References Cited

U.S. PATENT DOCUMENTS

| | | | |
|---|---|---|---|
| 6,434,441 B1* | 8/2002 | Beauchamp et al. | 700/98 |
| 6,868,297 B1* | 3/2005 | Rimoldi et al. | 700/98 |
| 7,099,738 B2* | 8/2006 | Ikeda et al. | 700/182 |
| 7,155,375 B1 | 12/2006 | Rimoldi et al. | |
| 2003/0210244 A1* | 11/2003 | Sasago et al. | 345/419 |
| 2005/0038642 A1* | 2/2005 | Rameau et al. | 704/1 |
| 2005/0114104 A1* | 5/2005 | Friedl et al. | 703/2 |
| 2005/0154481 A1* | 7/2005 | Berger et al. | 700/98 |
| 2008/0117205 A1* | 5/2008 | Storti et al. | 345/420 |
| 2009/0182450 A1* | 7/2009 | Goldschmidt | 700/182 |

OTHER PUBLICATIONS

Wozny et al., "A unified representation to support evaluation of design for manufacturability: Phase II", Jan. 1992.*
Wozny et al., "A unified representation to support evaluation of design for manufacturability: Phase III", Jan. 1993.*
Lindqvist, L, "Unified infrastructure for simulation, communication and execution of robotic systems", M.SC. thesis, Helsinki University of Technology, Aug. 2007.*
Dym, C., "Representing designed artifacts: the languages of engineering design", 1994.*
Srikanth et al., toward a unified representation of mechanical assemblies, 1990.*
Sriram et al., "GNOMES: an object oriented nonmanifold geometric engine", 1995.*

* cited by examiner

*Primary Examiner* — Kandasamy Thangavelu
(74) *Attorney, Agent, or Firm* — Blakely, Sokoloff, Taylor & Zafman LLP

(57) ABSTRACT

Apparatuses and methods for automating the generation of additional different models of a mechanical object from a first model by logically partitioning the different models based on parameters that are specific to the particular model being generated. All of the models are independent representations of the same mechanical object, and may represent the design of the mechanical object in different phases of the manufacturing process, for example, the conceptual design, the as-cast design, and the as-machined design. In one embodiment, upon receiving a selection of a feature for the first conceptual model from a user, the apparatus and method can automatically calculate the corresponding contributions for each of the different models. The corresponding contributions can be automatically calculated based on modeling parameters that are specific to the type of model that is to be automatically generated.

44 Claims, 14 Drawing Sheets

MULTI-REPRESENTATIONAL MODEL HAVING TWO OR MORE MODELS OF A MECHANICAL OBJECT

CROSS-REFERENCE TO RELATED APPLICATIONS

This application claims the benefit of U.S. Provisional Application No. 60/905,652 filed Mar. 7, 2007, which is hereby incorporated by reference.

FIELD

Embodiments of the invention relate to the field of computer-aided design (CAD) of physical parts and assemblies; and more specifically, to the generation of multi-representational model having two or more models of a mechanical object.

BACKGROUND

A typical CAD system employed in engineering contexts uses a geometry-oriented approach to define and represent engineering information. As a result, a designer is required to perform a number of low-level geometric operations in order to produce a final digital model of a desired product. In other words, the designer has to focus on the details of the geometry creation rather than the required functionality of the product. In addition, conventional CAD systems use a rigid history-based modeling approach that creates dependency between the operations performed by the designer when creating a digital model. That is, an earlier operation may influence subsequent operations or, alternatively, a subsequent operation may obliterate the functionality of a prior operation. This order dependent nature of feature operations makes it difficult for the designer to apply any modifications to the digital model or correct mistakes occurred early in the design process.

Further, conventional CAD systems do not allow members of a product development team to work together simultaneously, regardless of their locations or role, in order to create and finalize product definitions. Instead, current design intent collaborative practices are based on serial collaboration, in which copies of digital product files are passed back and forth among development team members who must wait to get these copies back before they can make or even suggest design refinements.

These problems also exist for conventional CAD systems that are used for cast fabrication modeling. Casting is a manufacturing process by which a liquid material, such as a suspension of minerals as used in ceramics or molten metal or plastic, is introduced into a mould, allowed to solidify within the mould, and then ejected or broken out to make a fabricated part. Casting is used for making parts of complex shape that would be difficult or uneconomical to make by other methods, such as cutting from solid material. Casting may be used to form hot, liquid metals or meltable plastics (called thermoplastics), or various materials that cold set after mixing of components such as certain plastic resins such as epoxy, water setting materials such as concrete or plaster, and materials that become liquid or paste when moist such as clay, which when dry enough to be rigid is removed from the mold, further dried, and fired in a kiln or furnace.

The cast fabrication methodology is particularly challenging for the designer of mechanical parts since the product must be first thought in terms of its functionality ("conceptual" phase), then has to be designed in order to fulfill the needs of the cast fabrication process ("as-cast" model), and finally there is the modeling of the machining phase ("as-machined" model) that is usually needed to cut the material to its final specifications. The advent of CAD systems, which are commonly used to design such cast parts, has not dramatically improved the situation on this regard. In fact the three design phases, conceptual, casting, and machining, are still managed independently. Three separate models, and several files, are still necessary in any conventional CAD system to model cast parts. The evident consequence is the lack of flexibility to change anything in any file without compromising the consistency of the other files.

With the availability of multiple bodies, associative design, and cross-parts links in parametric CAD systems (like SolidWorks, Pro/ENGINEER, CATIA, I-DEAS, Unigraphics, and Autodesk Inventor) some of the obstacles have been removed, albeit at the cost of ever increasing complexity and rigidity of the parameterization.

A three-dimensional (3D) CAD system is a software application that can digitally represent a real-world product in a three-dimensional virtual space. Most advanced mechanical design is done with such 3D CAD systems. A feature-based 3D CAD system is a CAD system that implements a bottom-up approach, where complex products are built one step at a time with elementary building blocks, the features. Features may include blocks, cylinders, simple extrusion of planar profiles, revolution of the planar profiles, or the like. Each building block is added or removed-from the result of the previous step. The CAD systems include a solid body, which is a 3D model of a homogeneous object, like a gear or a shaft, composed of features. The CAD system also includes parts and assemblies. A part is a file that contains one main solid body and optionally other solid bodies. An assembly is a file that contains an instance of the main body of different files.

FIG. 1A illustrates a conventional CAD system having an assembly and three parts 101, 102, and 103. The assembly 100 is a file that contains an instance of the main body of different parts, which are each stored in a separate file. The first part 101 includes a main body having multiple features, and possibly other bodies that each includes multiple features. Similarly, the second and third parts 102 and 103 each include a main body with multiple features, and possibly other bodies that include multiple features.

In order to precisely represent the mechanical object (e.g., product) with complete and correct design documents, three different solid bodies (models), such as the three different solid bodies for a mounting boss 110 of FIG. 1B. The three different phases of fabrication of the cast mounting boss 110 are illustrated in FIGS. 1C-1E—"as-designed" model 120 of FIG. 1C with the specifications for the correct functionality, "as-cast" model 130 of FIG. 1D with the specifications for a correct manufacturability, and "as-machined" model 140 of FIG. 1E with the specifications of the machining process. Conventional systems require that these three different solid bodies stay in different files.

FIGS. 1C-1E illustrate the different phases of fabrication of a cast mounting boss 110. The fabrication method may be a cast iron and machining of the mounting boss 110. The function of the mounting boss 110 is to guide and hold in place a bolt that connects the part to some other parts of an assembly, as illustrated in the simple as-designed model 120 of FIG. 1C. As illustrated in the final as-machined model 140 of FIG. 1E, the planar faces F1 and F2 are smoothed by a precision cutting machine after the casting process. The hole F3 is drilled or bored on the cast part as well. The face F4 is slanted in two directions from the mid plane to facilitate the extraction of the part from the casting plates, as illustrated in the as-cast model 130 of FIG. 1D. Also, two rounds R1 and R2 are part of the as-cast model 130.

From a conceptual and functional point of view, the mounting boss 110 has a much simpler representation (e.g., model 120) than the finished mounting boss (i.e. after casting and machining), illustrated in the as-machined model 140 of FIG. 1E. The as-designed model 120 of FIG. 1C illustrates the shape that the mechanical designer, which may not be an expert of the casting process has devised in the design phase of the final product.

For the correct functioning of the part, faces F1, F2, and F3 must have precise dimensions and strict tolerances. Usually this cannot be achieved by the casting process that has looser tolerances, and F1, F2, and F3 are the result of a precision machining (milling, drilling/boring) process. As a consequence it is required that on the faces that will be machined there be enough extra material for the drill bits to byte. So the part coming out of the casting process, as represented by as-cast model 130 of FIG. 1D, is again different from both the conceptual ("as-designed" model 120) and the final ("as-machined" model 140). Therefore there is a need for a third intermediate model: the "as-cast" model 130 of FIG. 1D. In the "as-cast" model 130, there is no hole (it will be drilled) and extra metal on the top and bottom faces to account for future machining.

It should be noted that the three models have some similarities and some differences. For example, the faces F1, F2, F3 must be the same in the "as designed" and "as machined" models because they are essential to the functioning and the mating of the parts, but the slant of face F4 and the rounds R1, R2 are not in the "conceptual model" 120, since they are not essential to the functioning of the part, but only to the fabrication (e.g., the slanted faces facilitate the extraction of the part from the casting shells). Often in most cases, there is a different engineer that decides where to put the slanted faces and what is the right angle (draft angles), for example, a designer that is an expert on the casting phase.

In addition to the different solid bodies, the design of even a simple entity like a mounting boss 110 requires a plethora of features for each solid body. For example, the as-designed model 120 requires two features, an external cylinder 121 from which to remove the internal cylinder (hole) 122, as illustrated in FIG. 1C. The "as-cast" model 130 requires six features: the external cylinder 131, the extra metal on the top and bottom faces 132, a draft operation 133, and two rounds 134. The "as-machined" model 140 is similar to the "as-cast" model 130 with the machined volumes being removed.

As such, in order to manage the three different phases of the cast part in a conventional CAD system, the conventional CAD system needs to manage the three different models by organizing the design into different models and in different files as illustrated in FIG. 1F, and by using different set of features with different parameters for every simple design element (e.g., mounting boss 110).

As illustrated in FIG. 1F, the conventional CAD system has three files 150, 160, and 170 that include the different solid bodies of the mounting boss 110 of FIG. 1B. Each of the different models also include various different features, such as features 1-9, which are used to create the mounting boss for the particular model. For example, the file 150 includes the as-designed model 120 for the mounting boss and includes the as-designed mounting boss 151, which is made up of feature 2 153 being subtracted from feature 1 152. The file 160 includes the as-cast model 130 for the mounting boss and includes the as-cast mounting boss 161, which is made up of the summation of the features 1-6 162-165. The file 170 includes the as-machined model 140 for the mounting boss and includes the as-machined mounting boss 171, which is made up of the features 7-9 172-173 being subtracted from the as-cast mounting boss 161. The files 151-153 may be managed by separate designers, for example, designers that are experts in functional design, casting design, and machining design, respectively.

Conventional CAD systems for modeling cast parts may have the following drawbacks. The conventional CAD system does not have any understanding that the mounting boss 110 is essentially the same object in all three models (e.g., 120, 130, and 140) and that any change in any one of the models is likely to influence the other two models. A correlation among the mounting boss models using conventional systems can be achieved, at best, through a very complicated parameterization and modeling techniques called relational design and skeleton design that only a few specialized CAD operators understand. Also, in conventional CAD systems, there is no way to reduce the number of features that the operator needs to input, nor to reduce the complexity and overhead of managing multiple models, and consequently managing multiple files.

BRIEF SUMMARY

Described herein are apparatuses and methods for automating the generation of additional different models of a mechanical object from a first model by logically partitioning the different models based on parameters that are specific to the particular model being generated. All of the models are independent representations of the same mechanical object, and may represent the design of the mechanical object in different phases of the manufacturing process, for example, the conceptual design, the as-cast design, and the as-machined design. The additional different models are logically partitioned from the first model and modeled with different geometries that are specific to the type of model, for example, casting geometries, or machining geometries.

In one embodiment, upon receiving a selection of a feature for the first conceptual model from a user, the apparatus and method can automatically calculate the corresponding contributions for each of the different models. The corresponding contributions can be automatically calculated based on modeling parameters that are specific to the type of model that is to be automatically generated. By automatically calculating the contributions for each of the different models, most, if not all, of the design details needed for fabrication (e.g., casting and machining) are automatically calculated in a single design phase (e.g., the conceptual phase) of the design process, instead of being independently generated in different models in separate design phases. The modeling parameters may be specified by a user, or by a knowledge-based system. The feature is a multi-representational feature since the feature can be linked to more than one model and may manifest itself differently in each of the different models. In one embodiment, the various models are part of a multi-representational model that has two or more different models of the same mechanical object. The multi-representational model can be stored in a single file. One or more models of the multi-representational models can be displayed at any given time.

BRIEF DESCRIPTION OF THE DRAWINGS

The invention may best be understood by referring to the following description and accompanying drawings that are used to illustrate embodiments of the invention. In the drawings.

DETAILED DESCRIPTION

Figure 1A:
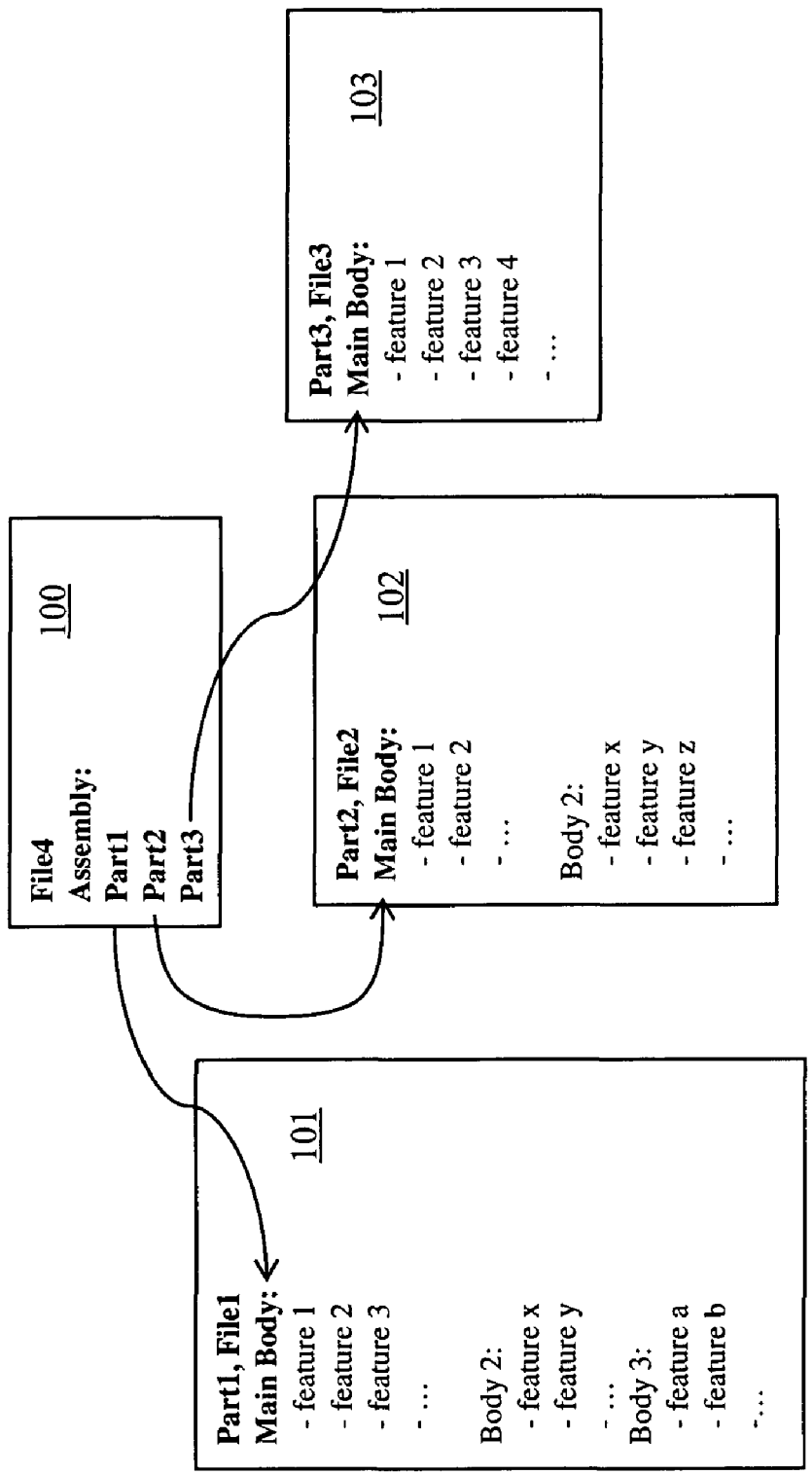
FIG. 1A illustrates a conventional CAD system having an assembly and three parts.
Figure 1B:
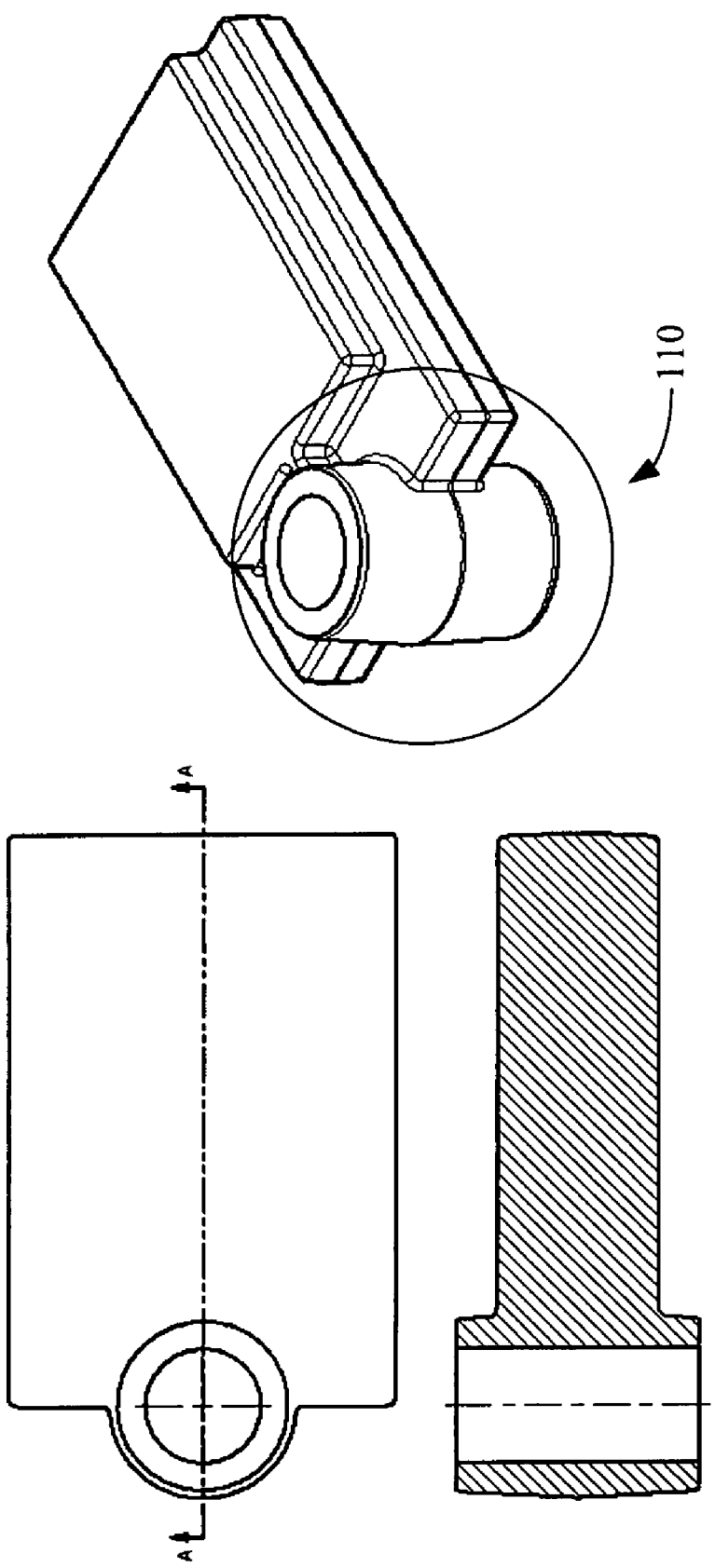
FIG. 1B illustrates a mounting boss.
Figure 1C:
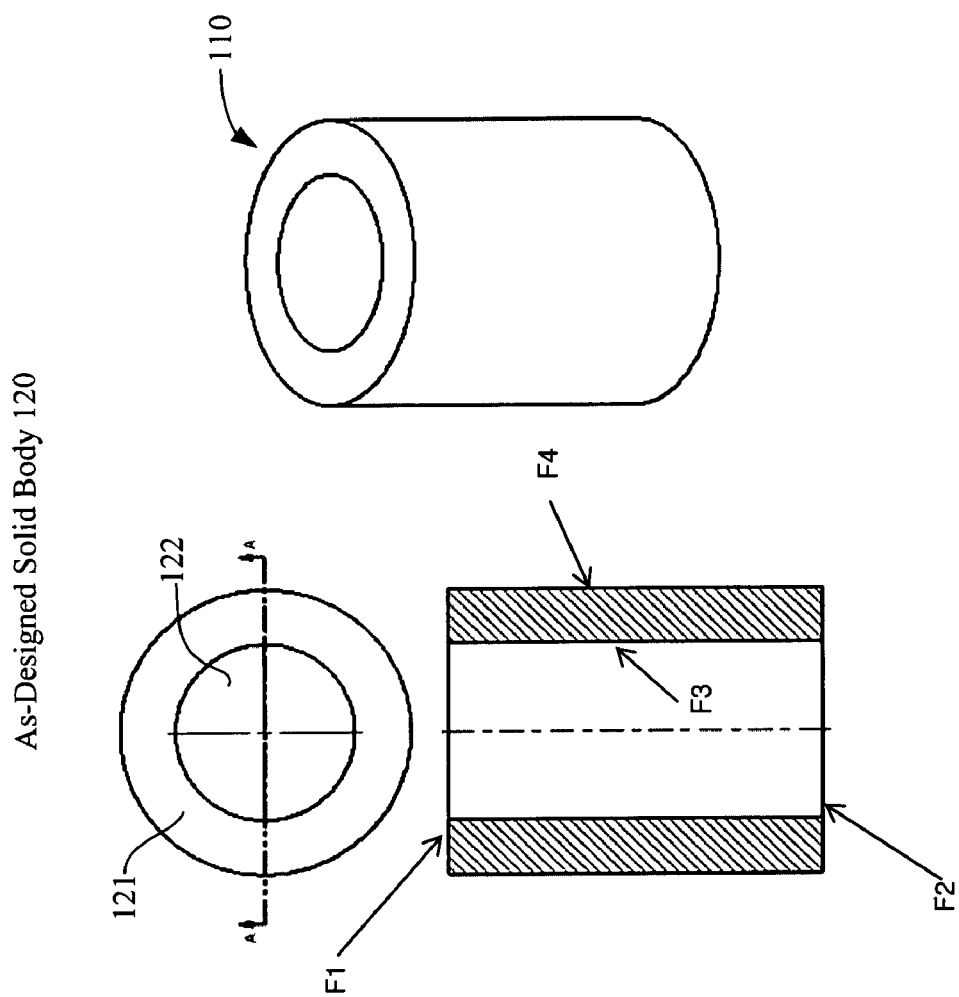
FIG. 1C illustrates an as-designed model of the mounting boss of FIG. 1B.
Figure 1D:
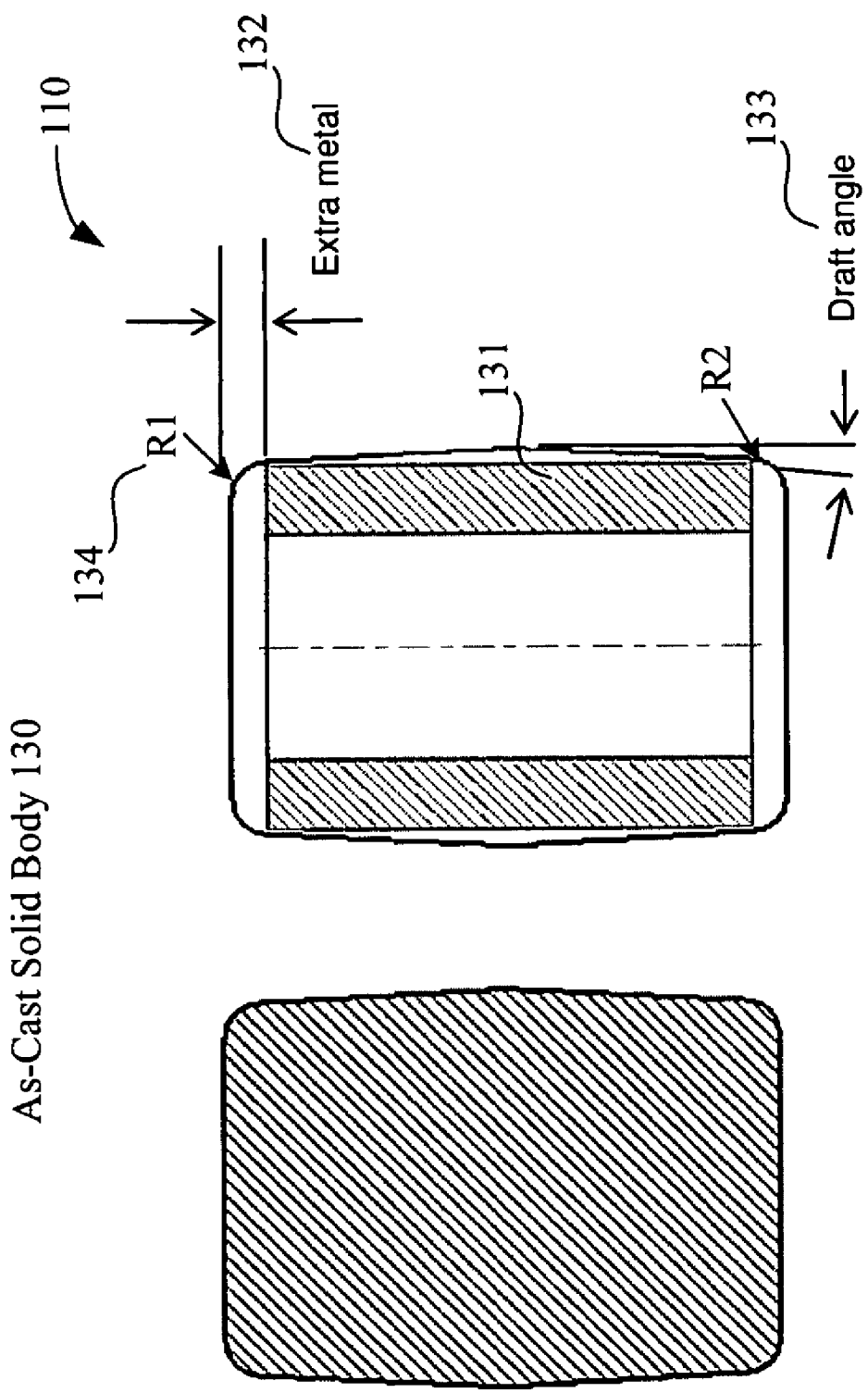
FIG. 1D illustrates an as-cast model of the mounting boss of FIG. 1B.
Figure 1E:
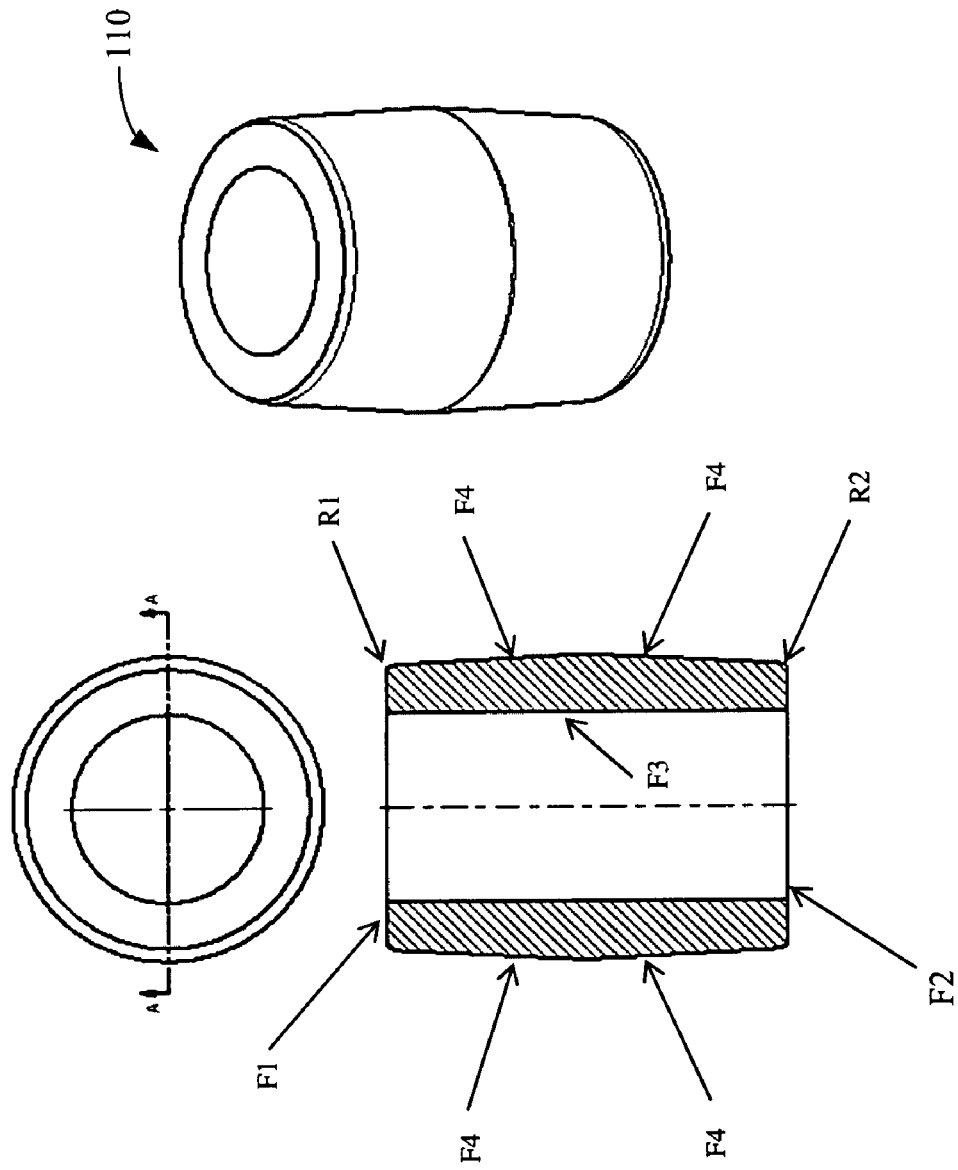
FIG. 1E illustrates an as-machined model of the mounting boss of FIG. 1B.
Figure 1F:
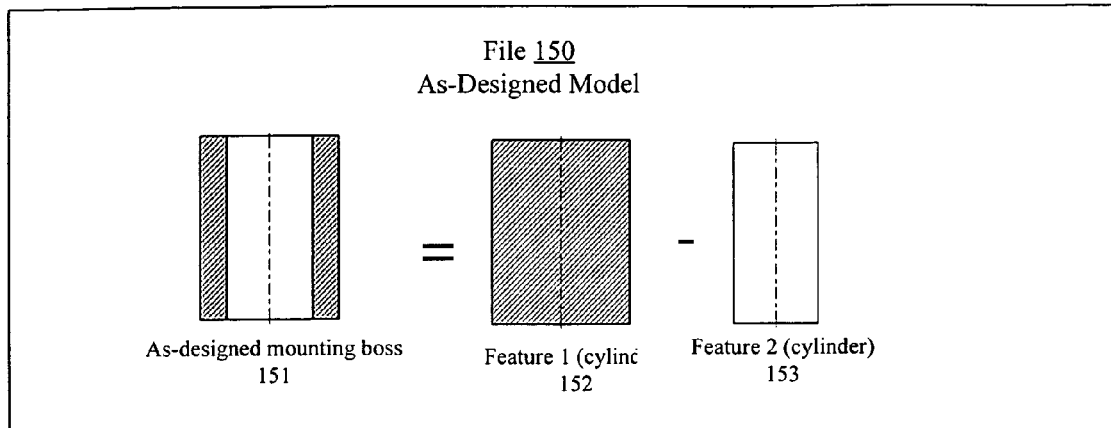
FIG. 1F illustrates three files of a conventional CAD system, each having a different model of the mounting boss of FIG. 1B.
Figure 1F:
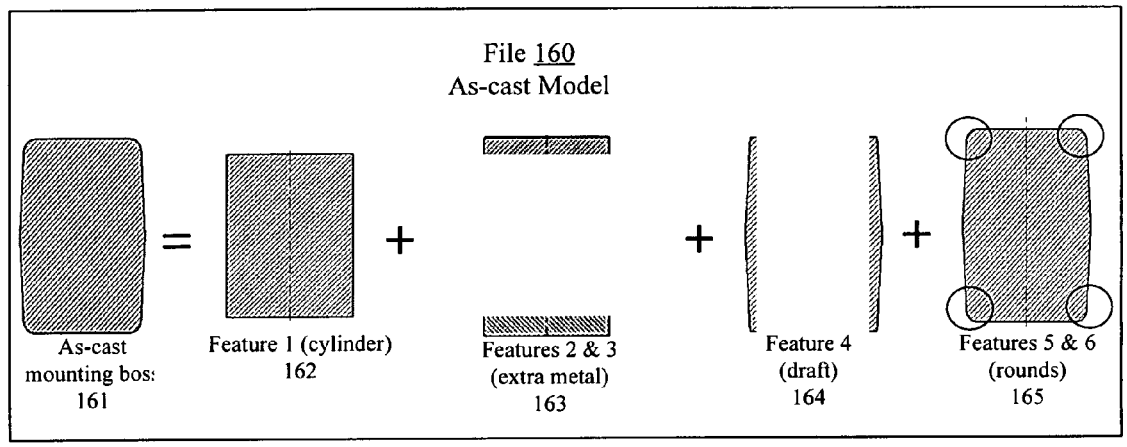
Figure 1F:
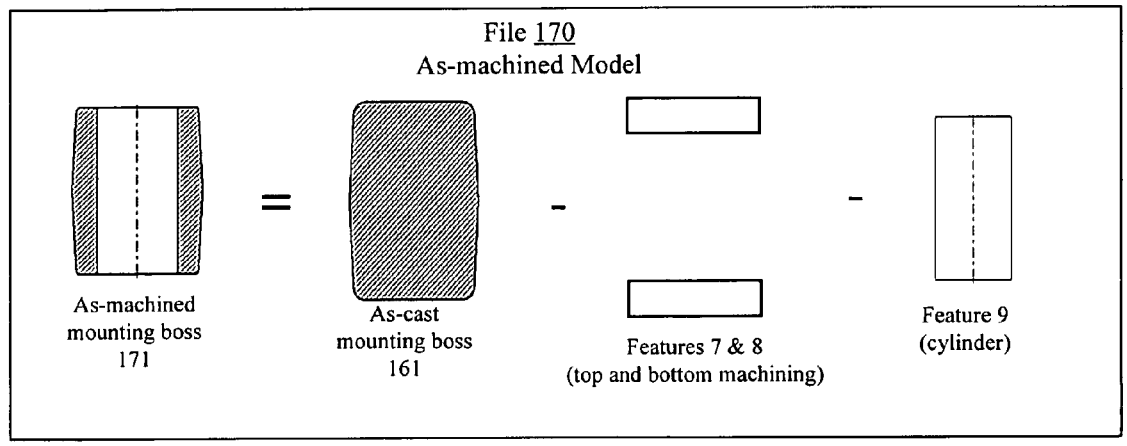

Described herein are apparatuses and methods directed to the automated generation of a multi-representational model having two or more models of a mechanical object. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of methods and apparatuses are described to automatically generate a second model of a mechanical object using a first model of the mechanical object and one or more specified modeling parameters. The one or more modeling parameters define how a multi-representational feature, which is linked to two or more independent solid bodies (e.g., models) of the same mechanical object, contributes to each of the independent solid bodies. For example, one of the modeling parameters may indicate an amount of material to be added to a face of a feature of the mechanical object to account for machining the face of the mechanical object to be within a tolerance (e.g., in an as-machined view of the mechanical object) or to account for casting (e.g., in an as-cast view of the mechanical object). The embodiments described herein are directed to overcome the obstacles and complexities associated with the design of cast parts using the conventional CAD systems as described above. The embodiments described herein allow the mechanical object (e.g., cast part) to be designed entirely in one file only, unlike conventional CAD systems that require multiple files to model the mechanical object. The embodiments described herein may allow design details needed for fabrication to be automatically computed in the conceptual phase of the design. The embodiments described herein may allow multiple representations of a model to be available at any time so that the users can visualize (and work on) either the "conceptual" representation, or one of the other representations, such as the "as-cast" representation, the "as-machined" representation, or the like. It is also possible to display all the representations at the same time, for example, on different windows of the CAD application, on multiple displays connected to the same computer, or the like. The embodiments described herein may provide an advantage over the conventional CAD system for designing cast parts by streamlining the design process considerably, and by providing consistency and flexibility to late-stage design changes.

As described above, features are the elementary building blocks for modeling a mechanical object in a CAD system. The features may include blocks, cylinders, simple extrusion of planar profiles, revolution of the planar profiles, or the like. In order to effectively represent a model for a mechanical object (e.g., cast metal part or cast plastic part), a unique solid body is needed that can have three different representations or views (e.g., models): 1) "as-designed" model, which is purely conceptual, the features have no drafts, no fillets, or the like. In terms of functional modeling, the features contribute only "added" and "protected" behaviors; 2) "as-cast" model, in which drafts and fillets, and other material-adding operations are added to the solid body. The concept of intrinsic contextual features, typical of certain implementations of functional modeling, may be beneficial in this model. In one embodiment, the draft angles add material to the object and the neutral face that has the machining specifications does not have any added material. In the "as-cast" model, most protected contributions are deactivated and extra material is added on faces for future machining to exact specifications, when functional modeling is used; and 3) "as-machined" model, which is the "as-cast" model with the protected portion "active" and the machined material removed.

The embodiments described herein, unlike the conventional CAD systems, include a set of new features. The set of new features are multi-representational features or polymorphic features that can be used to design any product to be manufactured through cast and machining processes. The multi-representational features are able to produce, and therefore encapsulate, substantially simultaneously all the geometry that is necessary to build two or more different representations (as-designed model, as-cast model, and/or as-machined model) of the mechanical object. The multi-representational features can be linked to two or more independent bodies of the different representations, unlike the "regular" features that correspond only to one solid body of a single representation. In effect, the multi-representational features are multi-model features that can be used in more than one model. The multi-representational features are similar to conventional features in that they can be assembled one by one in a feature-based 3D CAD system, such as a history-based CAD system or a functional modeling-based 3D CAD system. One example of a functional modeling-based 3D CAD system is described in U.S. Pat. No. 6,868,297, available from ImpactXoft, Inc. of San Jose, Calif. Like conventional CAD systems, embodiments of the CAD system described herein include a solid body, also referred to as model, which is a 3D model of a homogeneous object, like a gear or a shaft, composed of the new set of features for each of the different models of the multi-representational model. Using the new set of features, embodiments herein allow two or more representations of the mechanical object to be created substantially simultaneously to effectively represent a multi-representational model for a mechanical object that has two or more different representations of the mechanical object. The new set of features can be used to calculate geometry of a feature that can be included in two or more independent solid bodies of different representations of the mechanical object in a multi-representational model. The geometry for the one or more additional representations may be calculated using geometry from a first representation, as well as one or more modeling parameters. For example, the mechanical object in the first representation has a first type of geometry and the mechanical object in the additional representations has a second type of geometry that is different than the first type. In one embodiment, the first representation is an as-designed model that includes functional specifications of the mechanical object and the second representation is an as-cast model that has manufacturing specifications of the mechanical object. In another embodiment, the first representation is an as-designed model that includes functional specifications of the mechanical object, the second representation is an as-cast model that has manufacturing specifications of the mechanical object, and the third representation is an as-machined model that has machining specifications of the mechanical object.

Each of the new set of multi-representational features may refer to a cast properties object for geometry-generating algorithms. The cast properties object defines one or more modeling parameters based on technical specifications (e.g., geometric specifications, manufacturing specifications, and/or machining specifications) specified by the user or by a knowledge-based system.

The embodiments described herein also include a new architecture for feature-based, multi-body CAD systems where the above mentioned multi-representational features are substantially simultaneously connected (or otherwise linked) to two or more different solid bodies in order to correctly generate the final models, for example, the as-designed, as-cast, and as-machined models.

The embodiments described herein may be implemented as an extension or add-on to any feature-based CAD system, converting the CAD system into a specialized system for design of cast parts. The extension or add-on can provide feature-based solid modeling and multiple bodies within the same part file. Although some of the embodiments described herein are directed to modeling cast metal parts, alternatively, the embodiments described herein may be implemented in a CAD system for the design of cast plastic parts, which are also referred to as injection-molded, plastic parts. It should be noted that there may be different types of "contributions" and "solid bodies" in the design of cast plastic parts. For example, in designing a cast plastic part there is no "as-machined" solid body because the plastic object is not machined after extraction from the molds. Also, the embodiments described herein may be implemented as the architectural foundation of a completely new system dedicated to the design of cast metal parts or cast plastic parts. The embodiments described herein may also be an extension or add-on to Functional Object Representation (FOR) and/or Functional Modeling, as described in U.S. Pat. No. 6,868,297.

Multi-Representational Features

When producing geometry for the "as-designed" model (e.g., a first solid body), a multi-representational feature has no drafts, no fillets, no extra metal. In this representation, the model is functionally correct and many checks and simulations can be performed in order to optimize the design functionally. The as-designed model can be generated in the conceptual phase of the design process.

When producing geometry for the "as-cast" model (e.g., a second solid body), a multi-representational feature has draft angles, fillets, and extra material. Holes and openings to be machined are filled with material and not visible. Draft angles always add material and the neutral face is usually the one with the machining specifications. The geometry for the "as-cast" model is automatically generated using one or more modeling parameters specified by the cast property object, described below.

When producing geometry for the "as-machined" model (e.g., a third solid body), a multi-representational feature looks similar to the "as-cast" model with the notable difference that the machined material is removed to show the result of the final product (e.g., cast metal part or cast plastic part). The geometry for the "as-machined" model is automatically generated using one or more modeling parameters specified by the cast property object, described below.

The multi-representational features do not necessarily "contribute" to all solid bodies (e.g., models). For example, manufacturing features (e.g., material removal) may only contribute to "as-designed" and "as-machined" models. Similarly, the multi-representational features may not have machining geometries and therefore contribute only to "as-cast" and "as-designed" models.

Cast Properties Object

The cast properties object holds most of the technical specifications that are necessary for the casting process and that are used by the multi-representational features to generate the correct geometry. The cast property object may be managed by a parameter controller, as described below. The cast properties may include, but are not limited to, a general round radius property, a general extra-material thickness property, a parting-element property, a pulling-direction property, a draft-angle property, a material-adding property, a material-removing property, a material-type property, or the like. The technical specifications could also be fetched from a knowledge-based system with the best practices in the fabrication methodologies. In one embodiment, the general extra-material thickness property indicates that machined extremities are thickened. For example, the draft, if present, generates a solid contribution to the "as-cast" and "as-machined" models, such as FORs. The fillets may be on the drafted solid. Also, a draft should be modified to only add material on the opposite sides of the parting element to facilitate extraction, leaving the two extremities neutral. The material added to the two extremities may also be protected contribution to the "as-machined" FOR.

In one embodiment, a global cast property is defined to provide modeling parameters to share among all the functional cast part features. In one embodiment, one cast property defines a fillet radius. The fillet radius may be used to round the sharp edges of the "as-cast" view. A cast property may also define modeling parameters, such as an added thickness parameter that is used to add extra material (e.g., metal)

to the faces that will be subsequently machined to precise machining specifications. In another embodiment, another cast property defines global draft properties that are used to provide modeling parameters that are useful for the definition of the draft operation on each feature's contribution to the "as-cast" view. In one embodiment, another cast property defines a fillet-generation parameter for automatically generating fillets. Many fillets can be defined automatically at the feature level, but several fillets are to be generated at the edges that are the intersection of different cast features. For example, a mechanical object may include both intrinsic fillets and fillets at the intersection between features (e.g., contributions). In one embodiment, a cast property can automatically define fillets using predicated rules for the modeling parameters to discover the required edges on the model topology. This way of defining fillets may be both very efficient, since it does not rely on the user selection of the individual edges, and very robust, since it is based on predicates instead of direct selection on the model itself.

Architecture for Feature-Based, Multi-body CAD Systems

As described above, in a history-based CAD system, each solid body holds an ordered list of "regular" features. Each feature either adds or removes material. The position in the list matters because material-adding and material-removing features produce different results in different sequences. Moreover, each feature is connected to (e.g., appears in) to exactly one and only one list. That is, one feature cannot belong to two different lists of two different solid bodies.

With the architecture described herein, the multi-representational features instead are a new type of features that can be connected to (e.g., appear in) more than one solid body at a time. However, the multi-representational features may manifest themselves differently in the different models based on the type of model. For example, a feature may have a first type of geometry in an as-designed model, and different types of geometries in the as-cast and/or as-machined models. In one embodiment, the multi-representational feature can connect to three predefined solid bodies, as-designed, as-cast, and as-machined.

When connected to a solid body, a multi-representational feature may add more than one "contribution" to the solid body at different positions in the ordered list. Each contribution may be of material-adding or material-removing nature. That is, the multi-representational feature operates like many different "regular" features do in different solid bodies. In particular, the material-removing contributions need to be placed "at the end" of the ordered list since the machining operations are the last to be performed to fabricate a product. Alternatively, using FORs, no ordered lists are needed.

By way of a user interface, the user can select to display any model on the display or even all of the different models simultaneously on three different windows, or on the same window overlapping each other, for example, with varying translucency properties, or at a distance in the virtual space. In one embodiment, a browser that displays the ordered list of features of each solid body only shows the multi-representational feature and all their contributions and internal implementation detail remain invisible to the user. Alternatively, the browser can display the multi-representational features and their corresponding contributions and implementation details.

Figure 2:
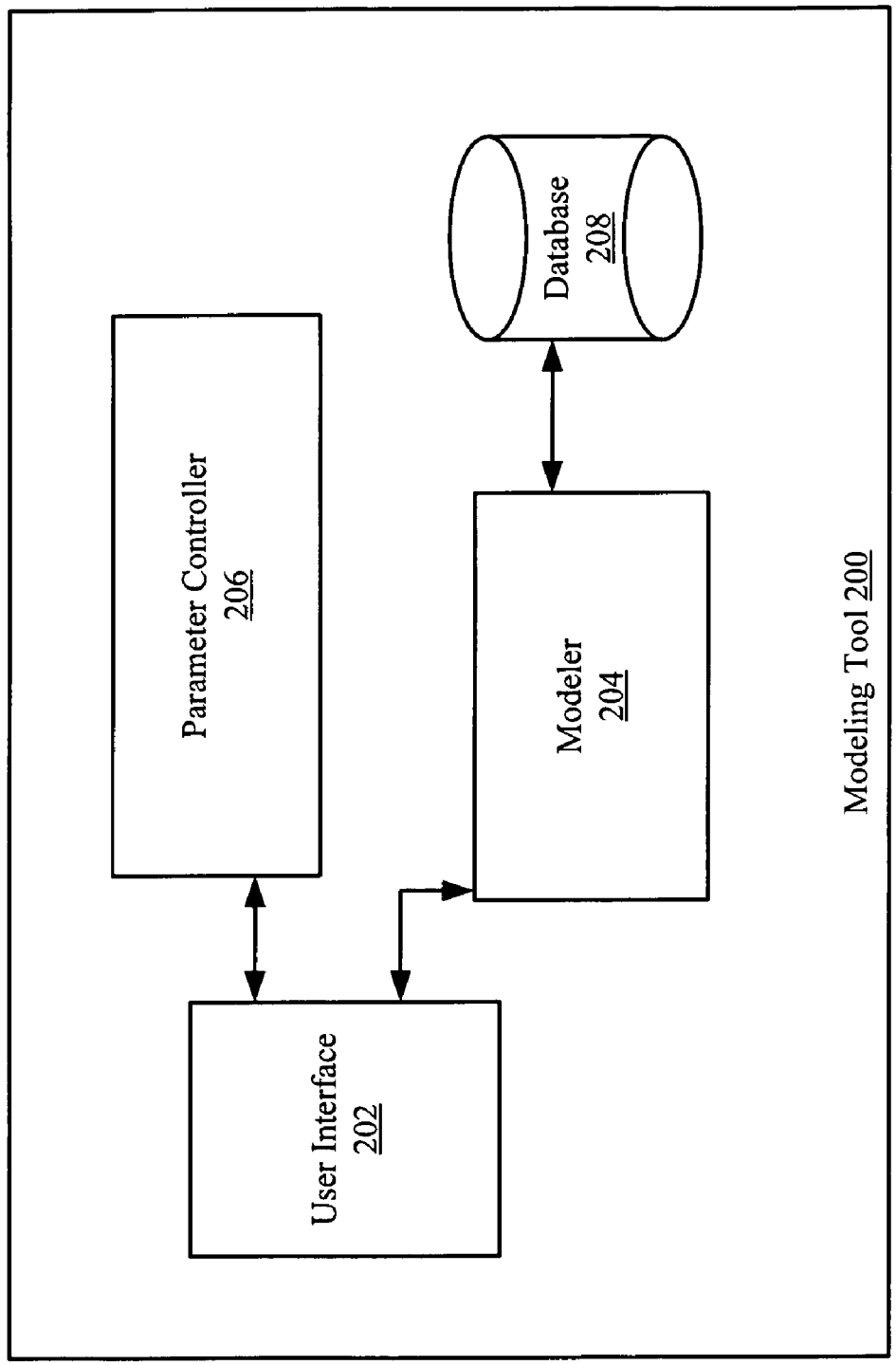
FIG. 2 illustrates a block diagram of one embodiment of a modeling tool for modeling a mechanical object in a multi-representational model having two or more models of the mechanical object.

FIG. 2 illustrates a block diagram of one embodiment of a modeling tool 200 for modeling a mechanical object in a multi-representational model having two or more models of the mechanical object. Referring to FIG. 2, the modeling tool 200 includes a parameter controller 206, a user interface 202, a modeler 204, and a database 208. The parameter controller 206 maintains modeling parameters for various design features. That is, the parameter controller 206 may manage the cast property object. These design features are multi-representational features and may include, but are not limited to, a round, a draft, a cylinder, a pocket, a cutout, a rib, a boss, a box, a hole, extra material (e.g., metal), machining areas, or the like. The modeling parameters define how the feature is modified for each of the different models. For example, a parameter may pertain to the shellability of a box, the thickness of a pocket's wall, the material-adding contributions for machining, the material-adding contributions for casting, or the like. In one embodiment, the modeling parameters of design features are defined based on the rules and logic of a specific application in which these multi-representational features are used.

The user interface 202 displays a set of multi-representational features to the user and further displays a list of modeling parameters for a multi-representational feature selected by the user. The user can then select one or more modeling parameters from the list. In one embodiment, the user may also select some geometric specifications (e.g., a diameter of a hole), manufacturing specifications (e.g., type of material, draft angles), and/or machining specifications (e.g., amount of extra material for machining) for the multi-representational feature. The use can also select one or more behavioral parameters that define the functionality of the multi-representational feature, for example, when using FORs for each of the different models. In one embodiment, the behavioral parameters specified by the user not only define the functionality of the multi-representational feature itself, but also the relations between this multi-representational feature and other design elements associated with the mechanical object. In one embodiment, the modeling parameters specified by the user as well as other data pertaining to the multi-representational feature, such as behavioral parameters, are stored in database 208. The user interface 202 is configured to allow display and selection of multi-representational features and modeling parameters (e.g., modeling parameters defined by the cast properties object). This may be done in separate components of the user interface 202, such as a multi-representational features component and a cast properties component. The multi-representational features user interface may be configured to present to the user all the modeling parameters and options to correctly evaluate the different contributions to the solid bodies. These modeling parameters may include, but are not limited to, machining specifications (e.g., boring diameters, boring depths, boring tolerances, motion ranges, or the like), which sides are machined, on which face the draft neutral element coincides, or the like. The cast properties user interface may include all the global specifications, such as added thickness specifications for the extra thickness needed for precision machining, general fillet specifications, parting line specifications, draft angle specifications, or the like, as well as the options to display one or more of the different solid bodies. The global specifications can be used by all the multi-representational features (e.g., functional cast features).

The modeler 204 is responsible for modeling design feature upon receiving data pertaining to the user's selection of modeling parameters (and geometric, manufacturing, and/or machining parameters when specified by the user). That is, modeler 204 performs a modeling algorithm to calculate and generate the geometry of the multi-representational feature without user interaction. The calculation is performed using the modeling parameters specified by the user. In one embodiment, the calculation is performed using a constant algorithm as will be described in more detail below. Unlike conventional CAD systems, the modeler 204 is configured to not only generate a first model of a mechanical object, but also to automatically generate a second model of the mechanical object using the first model and one or more modeling parameters. The modeler 204 may also be configured to automatically generate a third model of the mechanical object using the first model and one or more modeling parameters. In another embodiment, the third model is automatically generated by the modeler 204 using the second model and one or more modeling parameters. In one embodiment, the mechanical object is a cast metal part. In another embodiment, the mechanical object is a cast plastic part. In one embodiment, the first model is an as-designed model, the second model is the as-cast model, and the third model is an as-machined model. The as-designed model includes a functional specification of the mechanical object, the as-cast model includes a manufacturing specification of the mechanical object, and the as-machined model includes a machining specification of the mechanical object.

In one embodiment, the first, second, and third models are functional object representations (FOR). In another embodiment, the first, second, and third models are models of a history-based CAD system that include an "ordered list" of operations. The embodiments described herein work especially well for feature-based, multi-body CAD systems based on functional modeling technology. In functional modeling, there is no "ordered list," but each solid body has partitions with specific behaviors. Therefore, the contributions of the multi-representational features are simply connected to the functional partitions of each of the FOR. The functional partitions of the FOR are defined as "solid" partition, for example, for material-adding geometries, or as "protected" partition, for example, for material-removing geometries.

In one embodiment, the new architecture that supports multiple-views body for functional cast parts can generate three FORs for the same part: as-designed, as-cast, and as-machined. Each FOR is synthesized in a body that can be made alternatively visible on the display. The multi-representational features, designed for functional cast parts, can generate contributions suitable for each of the three views (e.g., models), in that, each feature contributes to the three FORs the relevant volumes. For example, the additional features may be optionally added to the "as-cast" FOR, for example, to add material, and to the "as-machined" FOR, for example, to remove material. In another embodiment, the new architecture that supports multiple-views body for functional cast parts can be used in history-based CAD systems that include "ordered lists." In either system, the visible body (part body) may be switched between the alternate views (e.g., as-designed, as-cast, or as-machined) based on which view the user has decided to visualize.

In one embodiment, the user is allowed to modify the parameters of the design feature at any time during the design process. If the behavioral parameters being modified are geometric, the new geometry of the design feature retains the functionality that was intended by the user initially. Alternatively, if the user requests to modify any behavioral parameter of the design feature, the new geometry of the design feature will reflect the change to the feature's modified functionality.

In one embodiment, a change of one design feature may result in an automatic change of another design feature to maintain the intended functionality of the other design feature. The design features created by modeler 204 may not be affected by any previous or subsequent modeling operations unless specifically intended by the user. These design features may be associated into semantically complete clusters that can be used in different contexts.

The operations of the flow diagram will be described with reference to the exemplary embodiments of FIGS. 3-5. However, it should be understood that the operations of flow diagrams can be performed by embodiments of the invention other than those discussed with reference to FIGS. 3-5, and the embodiments discussed with reference to FIGS. 3-5 can perform operations different than those discussed with reference to the flow diagrams. The techniques shown in the figures can be implemented using code and data stored and executed on one or more computers. Such computers store and communicate (internally and with other computers over a network) code and data using computer-readable media, such as machine storage media (e.g., magnetic disks; optical disks; random access memory; read only memory; flash memory devices) and computer-readable transmission media (e.g., electrical, optical, acoustical or other form of propagated signals—such as carrier waves, infrared signals, digital signals, etc.). In addition, such computers typically include a set of one or more processors coupled to one or more other components, such as a storage device, a number of user input/output devices (e.g., a keyboard and a display), and a network connection. The coupling of the set of processors and other components is typically through one or more busses and bridges (also termed as bus controllers). The storage device and network traffic respectively represent one or more computer-readable storage media and computer-readable transmission media. Thus, the storage device of a given computer system typically stores code and data for execution on the set of one or more processors of that computer. Of course, one or more parts of an embodiment of the invention may be implemented using different combinations of software, firmware, and/or hardware.

Algorithm for Multi-Representational Feature in a History-Based CAD System

Figure 3:
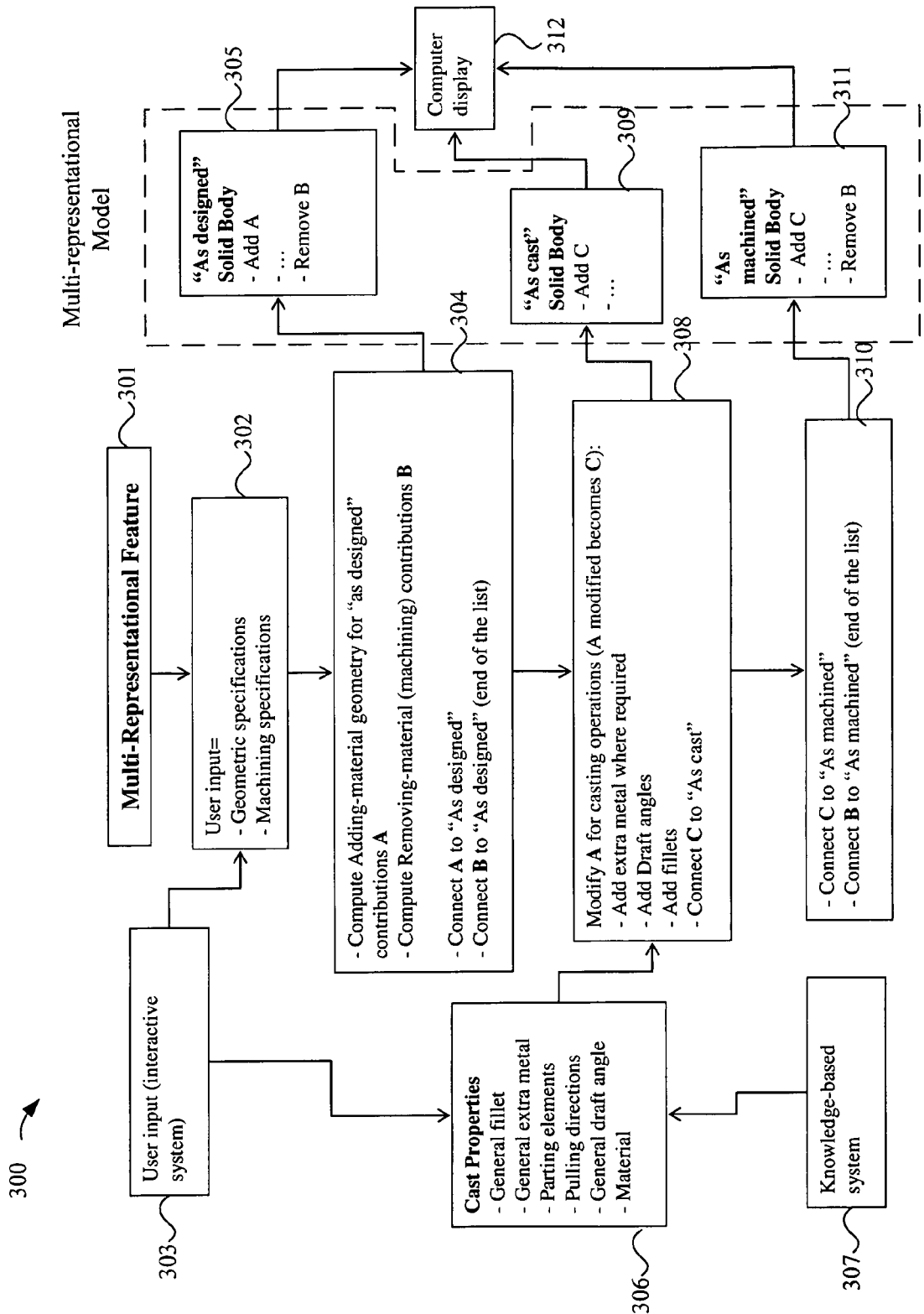
FIG. 3 illustrates a flow diagram of one embodiment of a method in a history-based CAD system for designing a mechanical object in a multi-representational model having three models of the mechanical object.

FIG. 3 illustrates a flow diagram of one embodiment of a method 300 in a history-based CAD system for designing a mechanical object in a multi-representational model having three models of the mechanical object. The method 300 is an algorithm used to model a multi-representational feature in the multi-representational model of the mechanical object. Once a multi-representational feature is selected, operation 301, the modeler of the CAD system receives user input, such as geometric specification and machining specifications from the user, operation 302. The user input is received from the user interface 202, as described above. The user interface 202 receives the user input, such as through an interactive system with the user, operation 303. Once the modeler 204 has received the user input, the modeler 204 computes material-adding geometry for a first "as-designed" contribution (e.g., contribution A), and material-removing geometry for a second "as-designed" contribution (e.g., contribution B). The modeler 204 also connects (or otherwise links) the first contribution to the "as-designed" solid body (e.g., "as-designed" model), and connects the second contribution to the "as-designed" solid body at the end of the ordered list, operation 304. The modeler 204 also adds the first contribution (e.g., A) to the "as-designed" solid body of the multi-representational model and removes the second contribution (e.g., B) from the "as-designed" solid body, operation 305.

Next, the modeler 204 modifies the first contribution (e.g., A) for casting operations, by adding extra material (e.g., metal) where required, adding draft angles, and adding fillets. The modified first contribution becomes a third contribution (e.g., contribution C). In order to generate the third contribution from the first contribution, the modeler 204 accesses the cast properties object, managed by the parameter controller 206, operation 306. As described above, each of the multi-representational features refer to the cast properties object for the geometry-generating algorithms. The cast properties object holds most of the technical specifications that are necessary for the casting process and that are used by the multi-representational features to generate the correct geometry. The cast properties may include, but are not limited to, a general round radius property, a general extra-material thickness property, a parting-element property, a pulling-direction property, a draft-angle property, a material-adding property, a material-removing property, a material-type property, or the like. The cast properties object defines one or more modeling parameters based on technical specifications specified by the user, through the interactive system of operation 303. The technical specifications could also be fetched from a knowledge-based system with the best practices in the fabrication methodologies, operation 307. In one embodiment, the general extra-material thickness property indicates that machined extremities are thickened. For example, the draft, if present, generates a solid contribution to the "as-cast" and "as-machined" solid bodies. The fillets may be on the drafted solid. Also, a draft should be modified to only add material and to leave the two extremities neutral. The material added to the two extremities may also be protected contribution to the "as-machined" solid bodies. After using the cast properties object to modify the first contribution in generating the third contribution (e.g., C), the modeler 204 then connects the third contribution (e.g., C) to the "as-cast" solid body (e.g., "as-cast" model), operation 308.

Next, the modeler 204 adds the third contribution (e.g., C) to the "as-cast" solid body (e.g., "as-cast" model) of the multi-representational model, operation 309.

The modeler 204 also connects the third contribution (e.g., C) to the "as-machined" solid body (e.g., "as-machined" model), and connects the second contribution (e.g., B) to the "as-machined" solid body at the end of the ordered list, operation 310. The modeler 204 adds the third contribution (e.g., C) to the "as-machined" solid body of the multi-representational model and removes the second contribution (e.g., B) from the "as-machined" solid body, operation 311.

Once the corresponding contributions have been added to and removed from the solid bodies of the multi-representational model, the multi-representational model can be displayed on the display, operation 312. The multi-representational model allows multiple representations (e.g., solid bodies) of the mechanical object to be available at any time so that the users can visualize (and work on) either the "conceptual" representation (e.g., "as-designed" solid body) of the mechanical object, or one of the other representations of the mechanical object, such as the as-cast representation (e.g., "as-cast" solid body), the as-machined representation (e.g., "as-machined" solid body), or the like. It is also possible to display all the representations at the same time, for example, on different windows of the CAD application, on multiple displays connected to the same computer, or the like. In one embodiment, the display is part of the user interface 202. In another embodiment, the display is separate from the user interface 202. By way of the user interface 202, the user can select to display any model on the display or even all of the different models simultaneously on three different windows or on the same window overlapping each other, for example, with varying translucency properties, or at a distance in the virtual space.

Once the corresponding contributions have been added to and removed from the solid bodies of the multi-representational model, each of the models can be stored in a single file as the multi-representational model. The single file can be stored in a storage device, locally on the computer running the CAD system, or remotely, such as in a database.

Using the method 300, contributions of the multi-representational feature can be substantially simultaneously connected (or otherwise linked) to two or more different solid bodies to correctly generate the final models (e.g., the "as-designed," "as-cast," and "as-machined" models). By generating the contributions for the first model (e.g., as-designed model), the modeler 204 automatically generates the contributions for one or more additional models (e.g., as-cast and/or as-machined models) without user interaction. The modeler 204 automatically generates the contributions for the other models using the contributions computed for the first model, and one or more modeling parameters that are either specified by the user or by a knowledge-based system.

Figure 4:
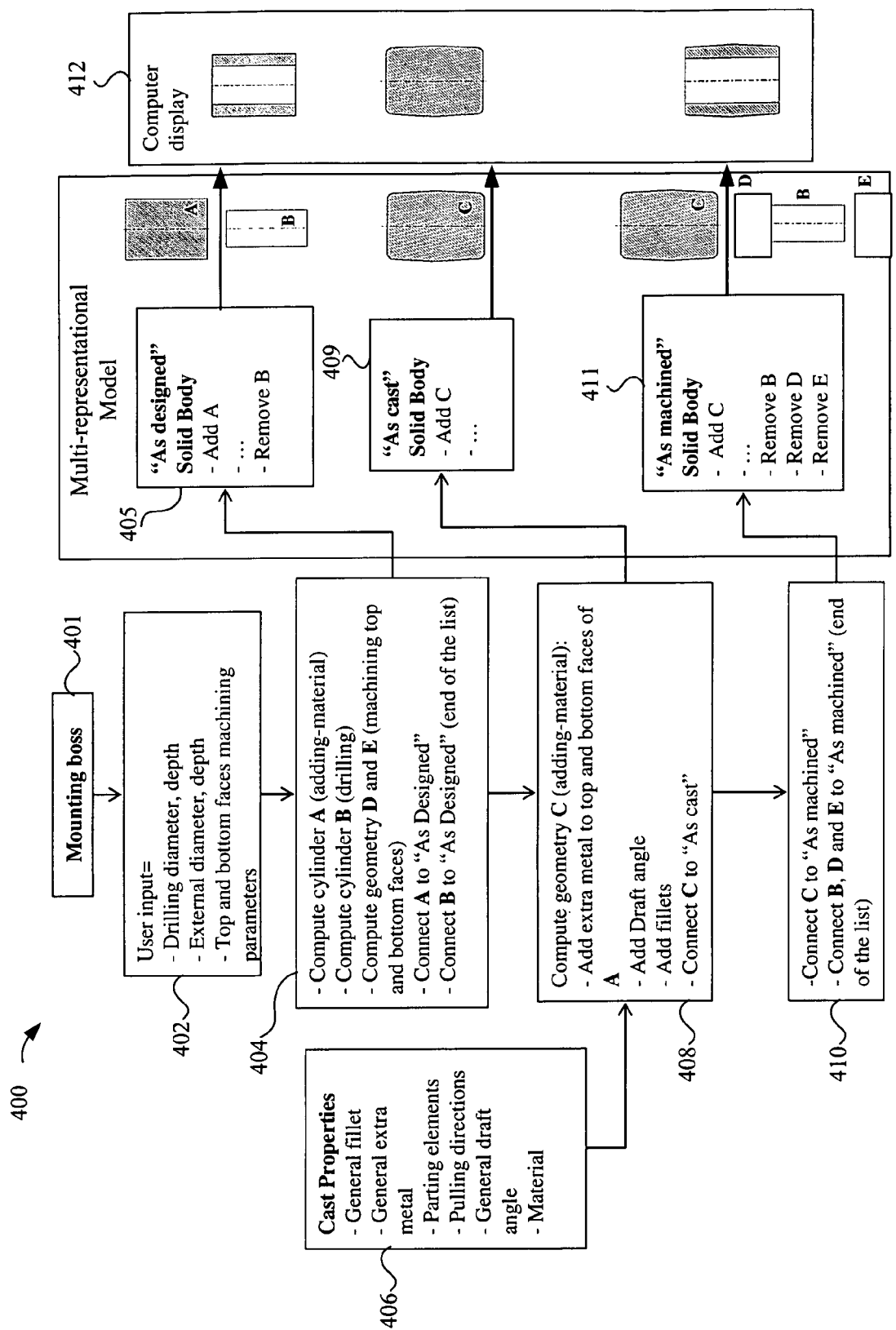
FIG. 4 illustrates a flow diagram of one exemplary embodiment of a method for designing a mounting boss in a multi-representational model having three models of the mounting boss.

FIG. 4 illustrates a flow diagram of one exemplary embodiment of a method for designing a mounting boss in a multi-representational model having three models of the mounting boss. The method 400 is an algorithm used to model a mounting boss (e.g., like the mounting boss 110) in the multi-representational model of the mounting boss. Once the mounting boss feature is selected, operation 401, the modeler 204 of the CAD system receives user input, such as geometric specification and machining specifications from the user, operation 402. For example, the modeler 204 receives as user input, the drilling diameter and depth, the external diameter and depth, and machining parameters for the top and bottom faces of the mounting boss. The user input is received from the user interface 202, as described above. Once the modeler 204 has received the user input, the modeler 204 computes material-adding geometry for a first cylinder contribution (e.g., contribution A), and material-removing geometry for a second cylinder contribution (e.g., contribution B). The modeler 204 also computes geometry for machining contributions for machining the top and bottom faces of the mounting boss (e.g., contributions D and E). The modeler 204 also connects (or otherwise links) the first cylinder contribution to the "as-designed" solid body (e.g., "as-designed" model), and connects the second cylinder contribution to the "as-designed" solid body at the end of the ordered list, operation 404. The modeler 204 also adds the first cylinder contribution (e.g., A) to the "as-designed" solid body of the multi-representational model and removes the second contribution (e.g., B) from the "as-designed" solid body, operation 405.

Next, the modeler 204 modifies the first cylinder contribution (e.g., A) for casting operations, by computing the geometry for adding extra material (e.g., metal) where required, for example, by adding extra metal to the top and bottom faces of the first cylinder contribution, adding draft angles, and adding fillets. The modified first cylinder contribution becomes a third contribution (e.g., contribution C). In order to generate the third contribution from the first contribution, the modeler 204 accesses the cast properties object, managed by the parameter controller 206, operation 406. The cast properties object defines one or more modeling parameters based on technical specifications specified by the user, through the interactive system (not illustrated in FIG. 4). The technical specifications could also be fetched from a knowledge-based system with the best practices in the fabrication methodologies (not illustrated in FIG. 4). After using the cast properties object to modify the first contribution in generating the third contribution (e.g., C), the modeler 204 then connects the third contribution (e.g., C) to the "as-cast" solid body (e.g., "as-cast" model), operation 408. Next, the modeler 204 adds the third contribution (e.g., C) to the "as-cast" solid body (e.g., "as-cast" model) of the multi-representational model, operation 409.

The modeler 204 also connects the third contribution (e.g., C) to the "as-machined" solid body (e.g., "as-machined" model), and connects the second contribution (e.g., B) to the "as-machined" solid body at the end of the ordered list, operation 410. The modeler 204 adds the third contribution (e.g., C) to the "as-machined" solid body of the multi-representational model and removes the second contribution (e.g., B) from the "as-machined" solid body, operation 411.

Once the corresponding contributions of the mounting boss have been added to and removed from the solid bodies of the multi-representational model, the multi-representational model can be displayed on the display, operation 412. The multi-representational model allows multiple representations (e.g., solid bodies) of the mechanical object to be available at any time so that the users can visualize (and work on) either the "conceptual" representation (e.g., "as-designed" solid body) of the mechanical object, or one of the other representations of the mechanical object, such as the as-cast representation (e.g., "as-cast" solid body), the as-machined representation (e.g., "as-machined" solid body).

Once the corresponding contributions of the mounting boss have been added to and removed from the solid bodies of the multi-representational model, each of the models can be stored in a single file as the multi-representational model. The single file can be stored in a storage device, locally on the computer running the CAD system, or remotely, such as in a database.

Using the method 400, contributions of the multi-representational feature can be substantially simultaneously connected (or otherwise linked) to two or more different solid bodies to correctly generate the final models (e.g., the "as-designed," "as-cast," and "as-machined" models) of the mounting boss. By generating the contributions for the first model (e.g., as-designed model), the modeler 204 automatically generates the contributions for one or more additional models (e.g., as-cast and/or as-machined models) without user interaction. The modeler 204 automatically generates the contributions for the other models using the contributions computed for the first model, and one or more modeling parameters that are either specified by the user or by a knowledge-based system.

It should be noted that although the embodiments described above are directed to modeling a mounting boss, in other embodiments, other types of mechanical objects can be modeled in the multi-representational model, such as components of an engine head, such as gaskets, water or oil jackets, joins, braces, tappets, cylinders, inlet and outlet values, CAM shafts, CAM shaft bearings, valve housings, valve spring housings, manifold shapes (ports), head-engine block, combustion chamber, or the like. In other embodiments, other types of mechanical objects can be modeled.

Figure 5:
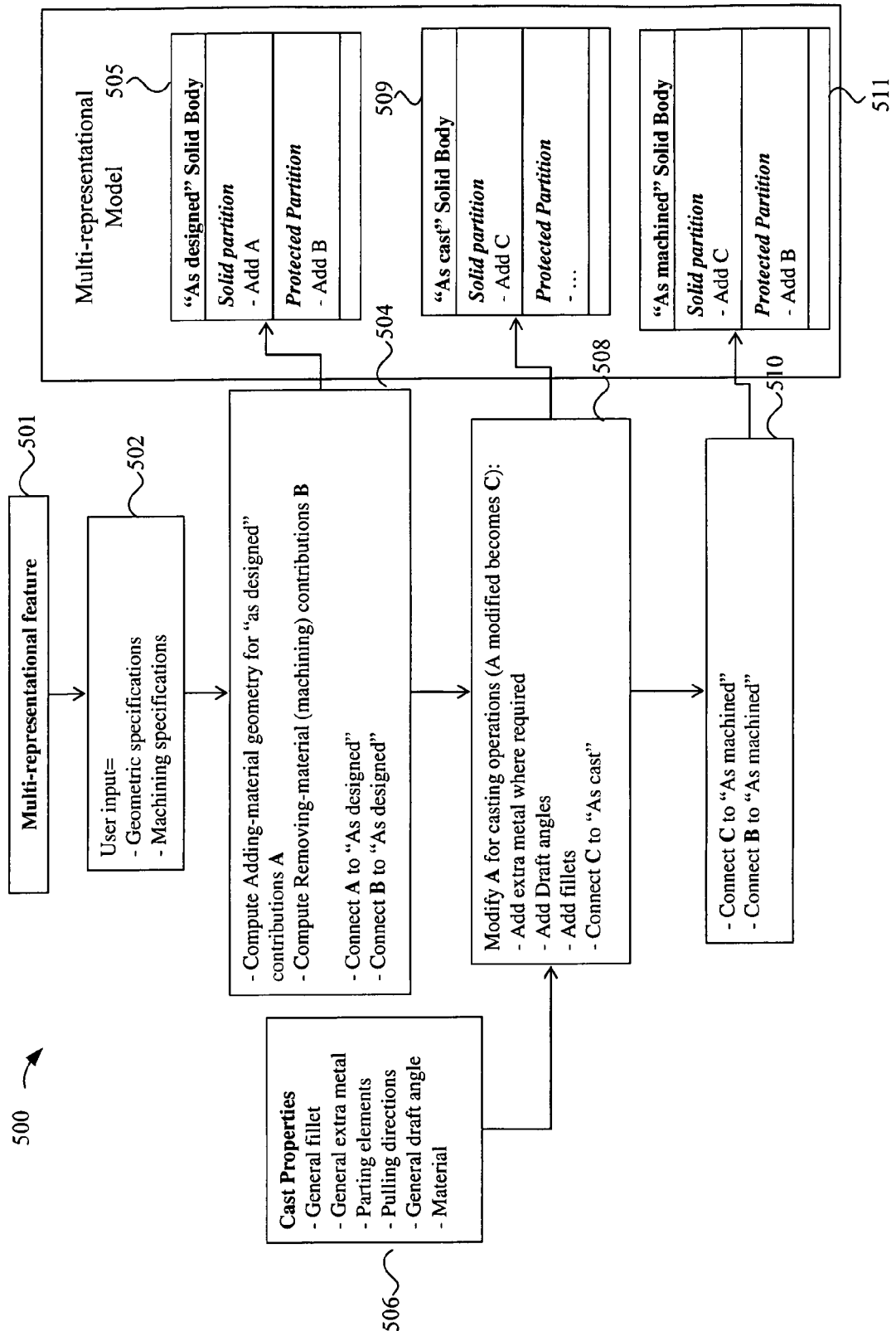
FIG. 5 illustrates a flow diagram of one embodiment of a method in a functional modeling-based CAD system for designing a mechanical object in a multi-representational model having three models of the mechanical object.

Algorithm for Multi-Representational Feature in a Functional-Modeling-Based CAD System FIG. 5 illustrates a flow diagram of one embodiment of a method in a functional modeling-based CAD system for designing a mechanical object in a multi-representational model having three models of the mechanical object. The method 500 is an algorithm used to model a multi-representational feature in the multi-representational model of the mechanical object. Once a multi-representational feature is selected, operation 501, the modeler 204 of the CAD system receives user input, such as geometric specification and machining specifications from the user, operation 502. The user input is received from the user interface 202, as described above. Once the modeler 204 has received the user input, the modeler 204 computes material-adding geometry for a first "as-designed" contribution (e.g., contribution A), and material-removing geometry for a second "as-designed" contribution (e.g., contribution B). The modeler 204 also connects (or otherwise links) the first contribution to the "as-designed" FOR (e.g., "as-designed" model), and connects the second contribution to the "as-designed" FOR, operation 504. It should be noted that the first and second contributions can be added to the "as-designed" FOR in any order, unlike operation 304 which requires the second contribution to be connected at the end of the list. The modeler 204 adds the first contribution (e.g., A) to the solid partition of the "as-designed" FOR of the multi-representational model and adds the second contribution (e.g., B) to the protected partition of the "as-designed" FOR, operation 505.

Next, the modeler 204 modifies the first contribution (e.g., A) for casting operations, by adding extra material (e.g., metal) where required, adding draft angles, and adding fillets. The modified first contribution becomes a third contribution (e.g., contribution C). In order to generate the third contribution from the first contribution, the modeler 204 accesses the cast properties object, managed by the parameter controller 206, operation 506. The cast properties object defines one or more modeling parameters based on technical specifications specified by the user, through the interactive system (not illustrated in FIG. 5). The technical specifications could also be fetched from a knowledge-based system with the best practices in the fabrication methodologies (not illustrated in FIG. 5). After using the cast properties object to modify the first contribution in generating the third contribution (e.g., C), the modeler 204 then connects the third contribution (e.g., C) to the "as-cast" FOR (e.g., "as-cast" model), operation 508. Next, the modeler 204 adds the third contribution (e.g., C) to the solid partition of the "as-cast" FOR (e.g., "as-cast" model) of the multi-representational model, operation 509.

The modeler 204 also connects the third contribution (e.g., C) to the "as-machined" FOR (e.g., "as-machined" model), and connects the second contribution (e.g., B) to the "as-machined" FOR, operation 510. Once again, the second contribution (e.g., B) does not need to be connected at the end of the list because the "as-cast" model is a FOR, not an ordered list. The modeler 204 adds the third contribution (e.g., C) to the solid partition of the "as-machined" FOR of the multi-representational model and adds the second contribution (e.g., B) to the protected partition of the "as-machined" FOR, operation 511.

Once the corresponding contributions have been added to the solid and protected partitions of each of the FORs of the multi-representational model, the multi-representational model can be displayed on the display (not illustrated in FIG. 5). The multi-representational model allows multiple representations (e.g., FORs) of the mechanical object to be available at any time so that the users can visualize (and work on) either the "conceptual" representation (e.g., "as-designed" FOR) of the mechanical object, or one of the other representations of the mechanical object, such as the as-cast representation (e.g., "as-cast" FOR), the as-machined representation (e.g., "as-machined" FOR). It is also possible to display all the representations at the same time, for example, on different windows of the CAD application, on multiple displays connected to the same computer, or the like. By way of the user interface 202, the user can select to display any model on the display or even all of the different models simultaneously on three different windows or on the same window overlapping each other, for example, with varying translucency properties, or at a distance in the virtual space.

Once the corresponding contributions have been added to the solid and protected partitions of each of the FORs of the multi-representational model, each of the FORs can be stored in a single file as the multi-representational model. The single file can be stored in a storage device, locally on the computer running the CAD system, or remotely, such as in a database.

Using the method 500, contributions of the multi-representational feature can be substantially simultaneously connected (or otherwise linked) to two or more different FORs to correctly generate the final models (e.g., the "as-designed," "as-cast," and "as-machined" FORs). By generating the contributions for the first FOR (e.g., as-designed FOR), the modeler 204 automatically generates the contributions for one or more additional FORs (e.g., as-cast and/or as-machined FORs) without user interaction. The modeler 204 automatically generates the contributions for the other FORs using the contributions computed for the first FOR, and one or more modeling parameters that are either specified by the user or by a knowledge-based system. Alternatively, the modeler 204 may automatically generate the contributions for the other FORs using the contributions computed for a second FOR, and one or more modeling parameters that are either specified by the user or by a knowledge-based system.

Functional Modeling and Functional Object Representation

In one embodiment, the modeling is performed using a functional object representation (FOR) approach. Specifically, the body of an object being modeled is presented as a predefined set of body partitions. Each body partition is associated with a certain volume type. These volume types may include, for example, a volume representing a core of the object, a volume representing a cavity inside the object, a volume added outside of the core, a volume added across the core, a volume representing a clearance area within the object (e.g., a cutout), etc.

When the user selects a certain combination of behavioral parameters for a design feature, this combination is analyzed to determine which body partitions correspond to the design feature. The corresponding body partitions are then assigned volumes created by the design feature. These operations are performed for each design feature associated with the object. As a result, depending on a particular design, some body partitions may have volumes contributed by one or more design features while others may have no contributing volumes.

In one embodiment, for each digital model, a predefined set of body partitions is stored in a database with corresponding contributing volumes. Each body partition that has a contributing volume may also store a link to a design feature that has created this contributing volume. This link provides access to data pertaining to this design feature, including behavioral and geometrical parameters of the design feature. Accordingly, for every digital model, the database stores a set of data that encapsulates the behavioral properties of each design feature associated with the object.

Further, the contributing volumes of each design feature associated with the object are utilized to compute the digital model of the object. In one embodiment, a constant algorithm is used for the computation. That is, the algorithm may be defined and used for all objects in any industry or, alternatively, for all objects in a specific industry or application. In one embodiment, the digital model of the object can be re-computed at any time using the set of data stored in the database.

Accordingly, functional modeling abstracts the design features from their geometrical representation and allows the user to focus on high-level functional elements and operations, rather than the creation of the detailed geometry. In addition, by maintaining a set of data that encapsulates the behavioral properties of each design feature associated with the object during the design process, a history-independent modeling approach is provided, in which each design feature retains its functionality throughout the design process, regardless of any subsequent or prior modeling operations related to the object. Furthermore, functional modeling automatically infers and maintains the relationships between the design features of the digital model during the entire design process.

Functional modeling can also be used to allow simultaneous development of an object by several designers. That is, once a first designer makes a change to a digital model, the first designer can submit a request to communicate this change to a second designer. In one embodiment, this request causes a design tool operated by the first designer to extract data pertaining to the change from the database and send it to a server which forwards this data to a client device of the second designer.

Once a design tool residing on the client device of the second designer receives the data pertaining to the change, it analyzes this data, together with data pertaining to a digital version model created by the second designer, and integrates the change performed by the first designer into the digital model version created by the second designer. The same process can also be performed if the second designer modifies the digital model and decides to communicate this modification to the first designer. This process can be performed for any number of designers participating in simultaneous object development. As a result, multiple participants in object development can work in parallel, regardless of their location and role, to create and finalize object definitions.

Functional object representation (FOR) provides a history-independent approach for creating and maintaining data pertaining to a digital model. The FOR is based on a predefined set of body partitions that compose the body of the object being modeled. As described above, each body partition is associated with a certain volume type. These volume types may include, for example, a volume representing a core of the object, a volume representing a cavity inside the object, a volume added outside of the core, a volume added both inside and outside of the core, a volume representing a clearance area within the object (e.g., a cutout), etc.

Figure 6:
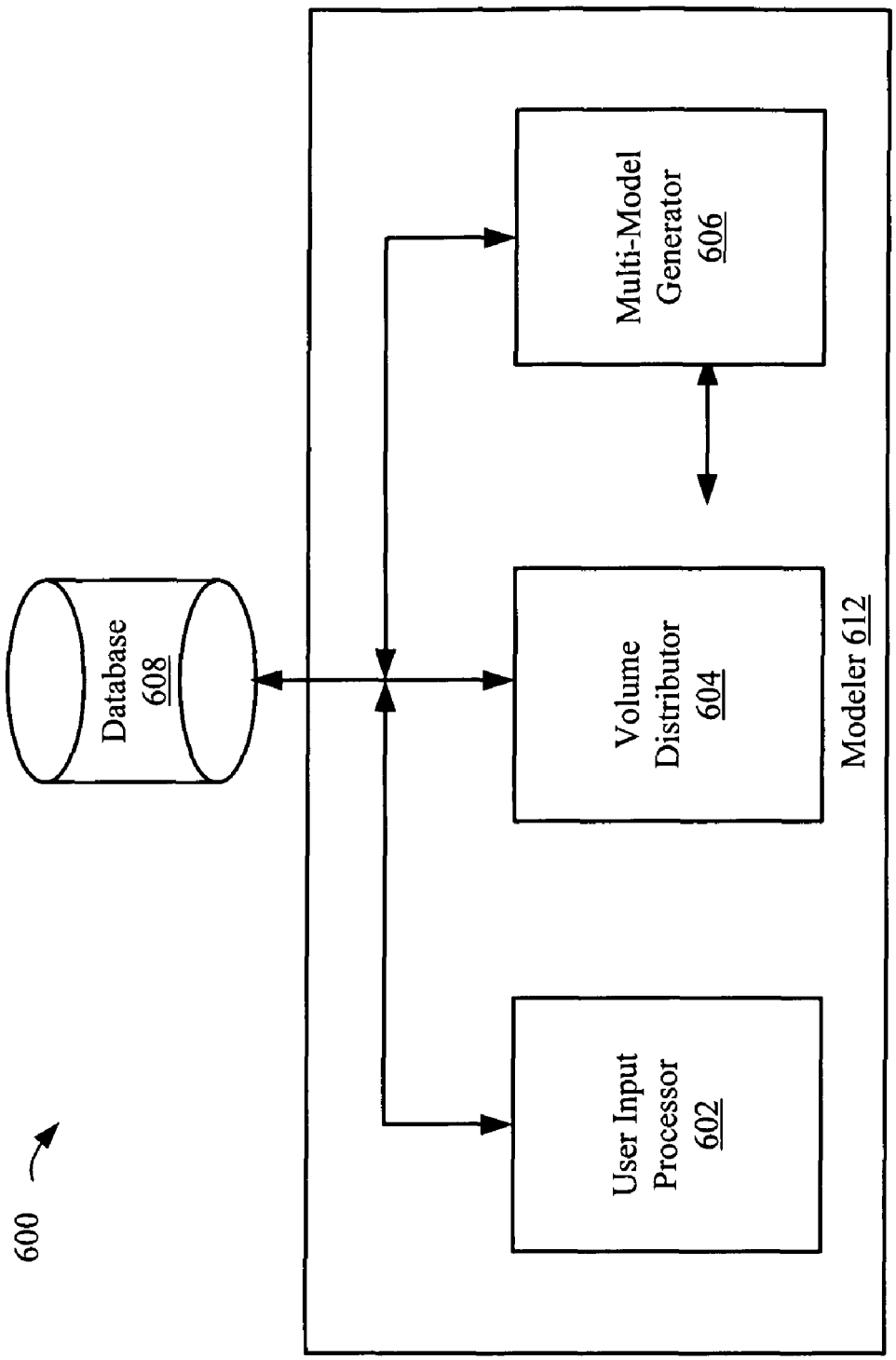
FIG. 6 illustrates a block diagram of one embodiment of a system for designing objects using functional object representation (FOR)

FIG. 6 is a block diagram of one embodiment of a system 600 for designing objects using functional object representation (FOR). Referring to FIG. 6, system 600 includes a modeler 612 (similar to the modeler 204 described above) and a database 608 (similar to the database 208). In one embodiment, modeler 612 includes a user input processor 602, a volume distributor 604, and a multi-model generator 606.

The user input processor 602 is responsible for receiving behavioral parameters selected by the user for each design feature and determining a correspondence between the behavioral parameters and body partitions. In one embodiment, a correspondence between a body partition and one or more behavioral parameters exists if a design feature creates a volume type associated with this body partition.

The volume distributor 604 is responsible for assigning (also referred to herein as connecting or linking) volumes created by each design feature to corresponding body partitions. Depending on the design of the object being modeled, some body partitions may have volumes from one or more design features while others may have no contributing volumes.

The multi-model generator 606 is responsible for computing a digital model of the object using the contributing volumes of each design feature associated with the object. However, the digital model includes multiple representations of the object. The digital model is a multi-representational model that has two or more models that have different geometries for the same object. In one embodiment, a constant algorithm is used for the computation. That is, this algorithm may be defined and used for all objects in any industry or, alternatively, for all objects in a specific industry or application. In one embodiment, the algorithm is defined by a static Boolean tree as will be described in greater detail below. It should be noted that the multi-model generator 606, not only generates a first representation of a mechanical object, such as for the conceptual geometry of the mechanical object, the multi-model generator 606 automatically generates one or more additional representations of the mechanical object using the first representation and one or more modeling parameters without user interaction. The one or more additional representations have geometries that are different than the conceptual geometry. The first and additional representations are part of a single, multi-representational model that can be stored in a single file and/or displayed on a display.

In one embodiment, database 608 stores a predefined set of body partitions with corresponding contributing volumes for each digital model. Each body partition that has a contributing volume may also store a link to a design feature that has created this contributing volume. This link provides access to data pertaining to this design feature, including behavioral and geometrical parameters of the design feature. Data pertaining to design features may also be stored in database 608.

Multi-model generator 606 can re-compute the digital model of the object at any time using the data stored in database 608.

Figure 7:
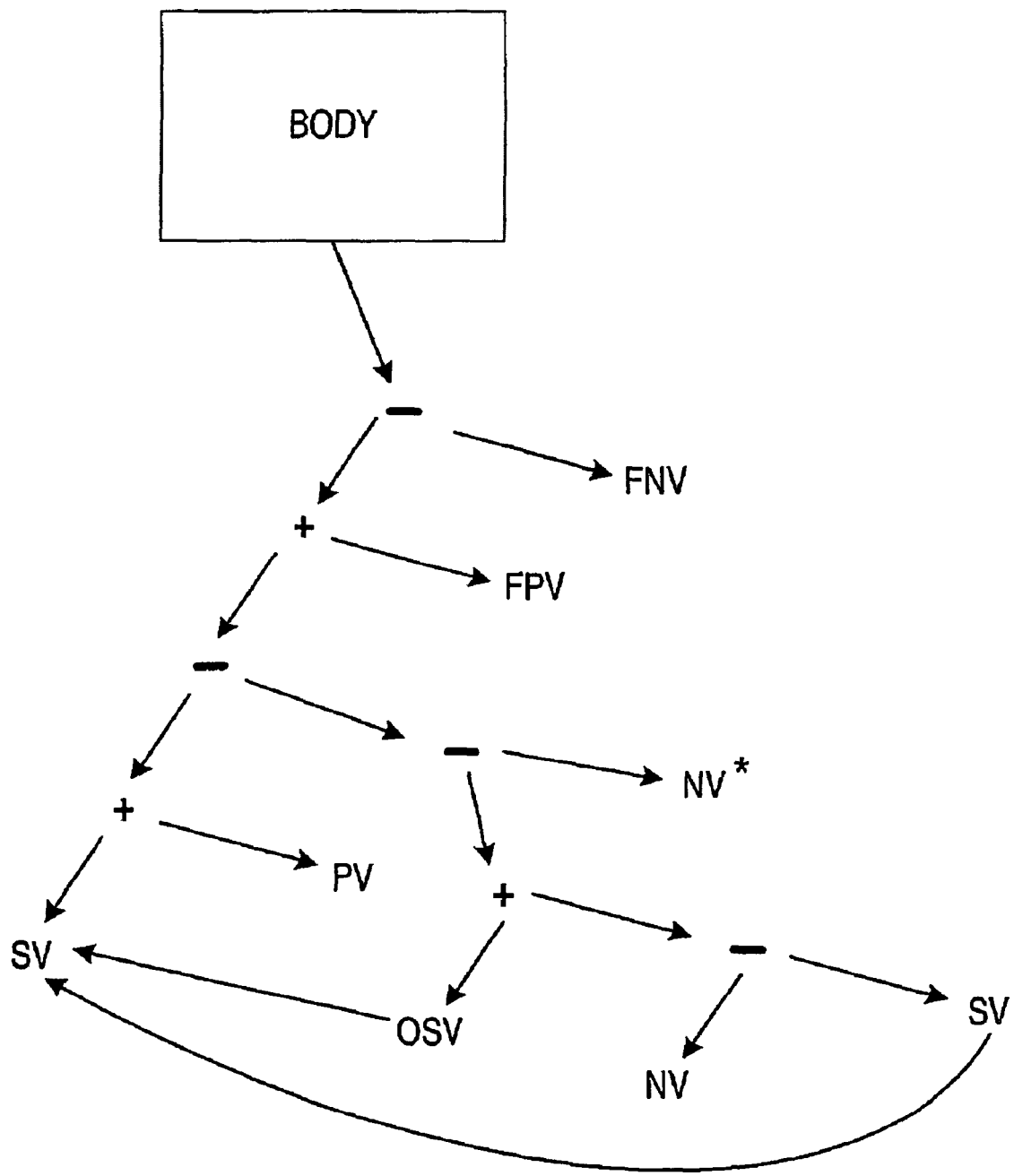
FIG. 7 illustrates one embodiment of a static Boolean tree that can be used to compute a digital model.

FIG. 7 illustrates one embodiment of a static Boolean tree that can be used to compute a digital model. Referring to FIG. 7, a solid body of an object is presented as a combination of body partitions (e.g., solid partitions and protected partitions). Each body partition is associated with a certain volume type. The volume types include shellable volumes (SV), positive volumes (PV), negative volumes (NV), negative volumes subtracted from a cavity within the body (NV*), operational shellable volumes (OSV), functional positive volumes (FPV), and functional negative volumes (FNV).

SV represents the volume of the body core. OSV represents the volume of the body's cavity. PV represents positive volumes added outside of the body. NV represents negative volumes subtracted from volumes located outside of the body. NV* represents negative volumes subtracted from the cavity. FPV represents positive volumes added both inside and outside of the core. FNV represents negative volumes of clearance areas inside and outside of the body.

The static Boolean tree defines the following constant algorithm for computing a digital model: Final body=SV+PV−[OSV+(NV−SV)−NV*]+FPV−FNV. This algorithm, which may be used for computing a digital model of any object or any object in a specific industry, is history-independent because it makes the order of introduction of the above volumes irrelevant for the resulting digital model.

In one embodiment, multiple static Boolean trees can be used to generate data pertaining to a multi-representational digital model of an object. For example, FIG. 8 illustrates how three static Boolean trees can be used to generate three FORs of the mounting boss for the multi-representational digital model that has three models, as-designed, as-cast, and as-machined models.

Figure 8:
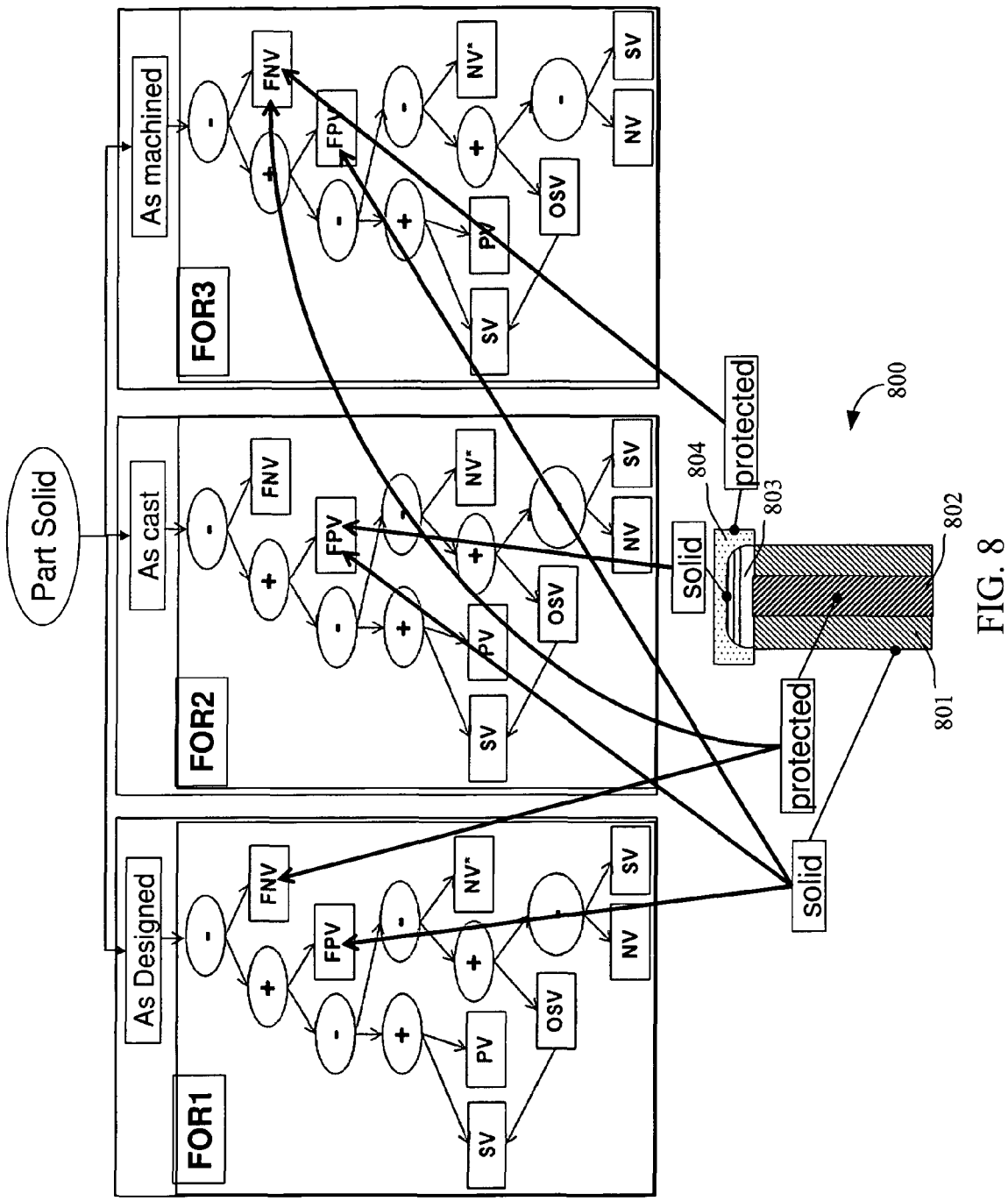
FIG. 8 illustrates one embodiment of three static Boolean trees that can be used in computing the three digital models of a multi-representational model.

FIG. 8 illustrates one embodiment of three static Boolean trees that can be used in computing the three digital models of a multi-representational model. The mounting boss 800 is a multi-representational model in that it can calculate geometries of contributions for the three different FORs. To generate the mounting boss 800 in the multi-representational model, the modeler 612 of the CAD system receives user input, such as geometric specification and machining specifications from the user at the user input processor 602, as described above. Once the modeler 612 has received the user input, the modeler 612 computes material-adding geometry for a first cylinder contribution 801 and material-removing geometry for a second cylindrical contribution 802 using the volume distributor 604. The modeler 612 also connects (or otherwise links) the first contribution 801 as a solid, functional positive volume (FPV) in the "as-designed" FOR1 (e.g., "as-designed" model), and connects the second contribution 802 as a protected, functional negative volume (FNV) in the "as-designed" FOR1 using the multi-model generator 606. It should be noted that the first and second contributions 801 and 802 can be added to the "as-designed" FOR1 in any order, unlike order-sensitive operations in an ordered set.

The modeler 612 also generates a third contribution 803 for casting operations using the volume distributor 604. The third contribution 803 is a material-adding contribution (e.g., metal) 803 on the top face, and possibly on the bottom face of the first contribution 801 (only top face illustrated in FIG. 8). The third contribution 803 is generated by accessing the modeling parameters for "extra metal" specified in the cast properties object, as described above. After using the cast properties object to generate the third contribution 803, the modeler 612 then connects the third contribution 803 as a solid, functional positive volume (FPV) in the "as-cast" FOR2 (e.g., "as-cast" model), as well as the first contribution 801 as a solid, functional positive volume (FPV) in the "as-cast" FOR2 using the multi-model generator 606.

The modeler 612 also generates a fourth contribution 804 for machining operations. The fourth contribution 804 is a material-removing contribution to simulate the planar cut on the top face of the mounting boss. The modeler 612 then connects the fourth contribution 804 as a protected, functional negative volume (FNV) in the "as-machined" FOR3 (e.g., "as-machined" model), as well as the first contribution 801 as a solid, functional positive volume (FPV) and second contribution 802 as a protected, functional negative volume (FNV) in the "as-machined" FOR3.

Once the corresponding contributions have been added to the solid and protected partitions of each of the FORs of the multi-representational model, the multi-representational model can be displayed on the display. Also, once the corresponding contributions have been added to the solid and protected partitions of each of the FORs of the multi-representational model, each of the FORs can be stored in a single file as the multi-representational model. The single file can be stored in a storage device, locally on the computer running the CAD system, or remotely, such as in the database 608.

Using FORs, contributions of the multi-representational feature (e.g., mounting boss 800) can be substantially simultaneously connected (or otherwise linked) to two or more different FORs to correctly generate the final models (e.g., the "as-designed," "as-cast," and "as-machined" models). By generating the contributions for the first FOR (e.g., as-designed model), the modeler 612 automatically generates the contributions for one or more additional FORs (e.g., as-cast and/or as-machined models) without user interaction. The modeler 612 automatically generates the contributions for the other FORs using the contributions computed for the first FOR, and one or more modeling parameters that are either specified by the user or by a knowledge-based system.

It should be noted that the contributing volumes FPV and FNV of each of the three FORs are linked to the solid and protected partitions of the mounting boss feature. The solid and protected partitions of the mounting boss feature are in turn linked to modeling parameters and/or behavioral parameters for the mounting boss feature, which is a multi-representational feature. The contributing volumes FNV and FPV are calculated using the modeling parameters (e.g., geometrical parameters) of corresponding design features (e.g., mounting boss feature). The data structure discussed above only needs to capture the functional data of individual design elements, thus providing an efficient way of storing and manipulating a set of data required for generating the two or more digital models of the multi-representational model. Accordingly, this set of data can be easily transported via a network.

In one embodiment, a product (e.g., cast metal part or cast plastic part) includes two or more related objects. In this embodiment, the body of one object may be linked to the body of a related object.

An Exemplary Computer System

Figure 9:
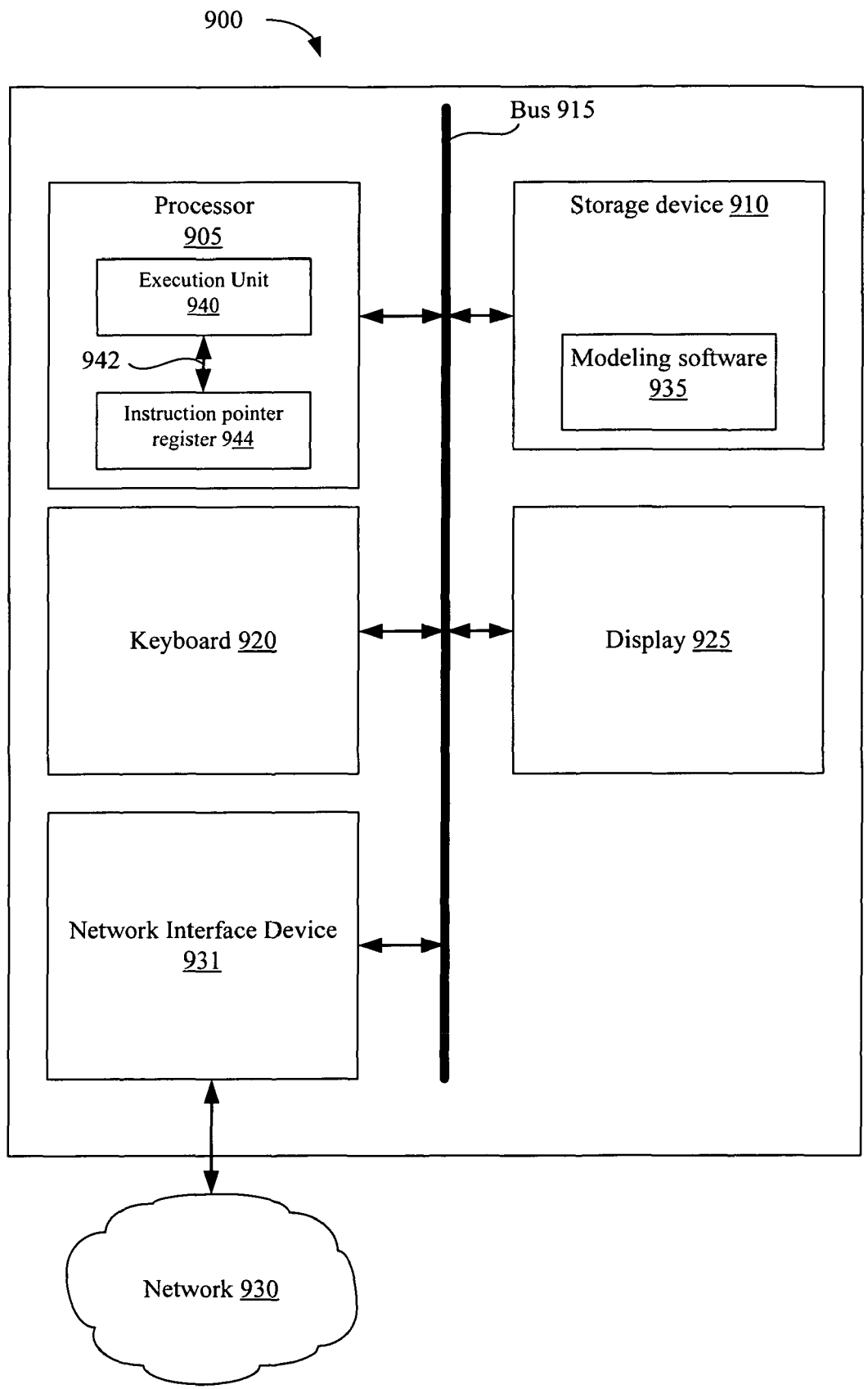
FIG. 9 shows a block diagram illustrating an exemplary computer system 700 according to one embodiment of the invention.

FIG. 9 shows a block diagram illustrating an exemplary computer system 900 according to one embodiment of the invention. The exemplary computer system 900 includes a processor 905 coupled to a storage device 910 by a bus 915. In addition, a number of user input/output devices, such as a keyboard 920 and a display 925, may also be coupled to the bus 915, but are optional parts. A network 930 may also be coupled to bus 915 by way of network interface device 931. The processor 905 represents a central processing unit of any type of architecture, such as a CISC, RISC, VLIW, or hybrid architecture. In addition, the processor 905 could be implemented on one or more chips. The storage device 910 and network traffic represents one or more computer-readable media. The bus 915 represents one or more busses and bridges (also termed as bus controllers). While this embodiment is described in relation to a single processor computer system, other embodiments could include a multi-processor computer system.

FIG. 9 also illustrates that the storage device 910 has stored therein modeling software 935 for execution on the processor 905 to perform embodiments of the processes described herein for generating a multi-representational model having two or more models of a mechanical object. Of course, the storage device 910 preferably contains additional software such as an operating system and various applications (not shown).

FIG. 9 additionally illustrates that the processor 905 includes an execution unit 940, an internal bus 942, and an instruction pointer register 944. Of course, processor 905 contains additional circuitry, which is not necessary to understanding this description.

The internal bus 942 couples several of the elements of the processor 905 together as shown. The execution unit 940 is used for executing instructions. The instruction pointer register 944 is used for storing an address of an instruction currently being executed by the execution unit 940.

The term storage area is used herein to refer to any mechanism for storing data, including locations in the storage device 910, one or more registers in the processor 905, etc.

The techniques shown in the figures can be implemented using code and data stored and executed on computers. Such computers store and communicate (internally and with other computers over a network) code and data using computer-readable media. Of course, one or more parts of an embodiment of the invention may be implemented using any combination of software, firmware, and/or hardware.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a computer-readable medium. These instructions may be used to program a general-purpose or special-purpose processor to perform the described operations. A computer-readable medium includes any mechanism for storing or transmitting information in a form (e.g., software, processing application) readable by a machine (e.g., a computer). The computer-readable storage medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory, or another type of medium suitable for storing electronic instructions. The computer-readable transmission medium may include, but is not limited to, electrical, optical, acoustical, or other form of propagated signal (e.g., carrier waves, infrared signals, digital signals, or the like), or another type of medium suitable for transmitting electronic instructions.

Additionally, some embodiments may be practiced in distributed computing environments where the computer-readable storage medium is stored on and/or executed by more than one computer system. In addition, the information transferred between computer systems may either be pulled or pushed across the transmission medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
   generating a first model of a mechanical object in a computer-aided design (CAD) system; and
   automatically generating a second model of the mechanical object using the first model and one or more modeling parameters,
   wherein the first model is an as-designed model that comprises conceptual geometry of the mechanical object and the second model is an as-cast model, and wherein the first and second models are part of a single, multi-representational model of the mechanical object.

2. The method of claim 1, wherein the mechanical object is a cast metal part.

3. The method of claim 1, wherein the mechanical object is a cast plastic part.

4. The method of claim 1, further comprising automatically generating a third model of the mechanical object using the first model and the one or more modeling parameters.

5. The method of claim 1, further comprising automatically generating a third model of the mechanical object using the second model and the one or more modeling parameters.

6. The method of claim 1, further comprising automatically generating a third model of the mechanical object using the first and second models.

7. The method of claim 6, wherein the third model is an as-machined model, and wherein the as-designed model comprises a functional specification of the mechanical object, the as-cast model comprises a manufacturing specification of the mechanical object, and the as-machined model comprises a machining specification of the mechanical object.

8. The method of claim 6, wherein the first, second, and third models are functional object representations (FOR).

9. The method of claim 1, wherein generating the first model comprises:
receiving user input specifications of a multi-representational feature for the mechanical object;
computing a first geometry for a first contribution to a solid body of the first model;
computing a second geometry for a second contribution to the solid body of the first model;
connecting the first contribution to the solid body; and
connecting the second contribution to the solid body, wherein the first and second contributions represent the multi-representational feature for the first model.

10. The method of claim 9, wherein the user input specifications are geometric specifications and machining specifications.

11. The method of claim 9, wherein automatically generating the second model comprises:
modifying the first contribution for casting operations based on the one or more modeling parameters, wherein the one or more modeling parameters are based on cast properties, wherein the modified first contribution is a third contribution; and
connecting the third contribution to a solid body of the second model, wherein the third contribution represents the multi-representational feature for the second model.

12. The method of claim 11, wherein the cast properties are specified by the user.

13. The method of claim 11, wherein generating the first model further comprises:
presenting to a user a list of multi-representational design features available for modeling, including the specified multi-representational feature for the mechanical object;
receiving a user selection of a multi-representational feature from the list of available multi-representational design features;
upon receiving the user selection of the multi-representational feature, identifying a plurality of modeling parameters applicable to the multi-representational feature selected by the user, and presenting the plurality of modeling parameters to the user;
receiving user input identifying the one or more modeling parameters selected from the plurality of modeling parameters by the user.

14. The method of claim 11, wherein the cast properties are specified by a knowledge-based system.

15. The method of claim 11, wherein the first geometry is a material-adding geometry and the second geometry is a material-removing geometry, wherein the first contribution is an as-designed contribution, and the second contribution is an as-designed contribution, and wherein the third contribution is an as-cast contribution.

16. The method of claim 11, wherein modifying the first contribution comprises adding extra material to the first contribution.

17. The method of claim 11, wherein modifying the first contribution comprises adding draft angles to the first contribution.

18. The method of claim 11, wherein modifying the first contribution comprises adding fillets to the first contribution.

19. The method of claim 11, further comprising automatically generating a third model of the mechanical object using the first and second models, wherein automatically generating the third model comprises:
connecting the third contribution to a solid body of the third model; and
connecting the second contribution to the solid body of the third model, wherein the third and second contributions represent the multi-representational feature for the third model.

20. The method of claim 19, wherein the CAD system is a functional modeling-based CAD system, wherein the first, second, and third models are functional object representations (FOR) of the mechanical object, and wherein each of the solid bodies of the FORs include a solid partition and a protected partition.

21. The method of claim 20, wherein generating the first model further comprises:
adding the first contribution to the solid partition of the first FOR; and
adding the second contribution to the protected partition of the first FOR, wherein automatically generating the second model further comprises adding the third contribution to the solid partition of the second FOR, and wherein automatically generating the third model further comprises:
adding the third contribution to the solid partition of the third FOR; and
adding the second contribution to the protected partition of the third FOR.

22. The method of claim 21, further comprising displaying at least one of the first, second, and third FORs on a display.

23. The method of claim 20, wherein generating the first model further comprises:
adding the first contribution to the solid body of the first model; and
removing the second contribution from the solid body of the first model after adding the first contribution, wherein automatically generating the second model further comprises adding the third contribution to the solid body of the second model, and wherein automatically generating the third model further comprises:
adding the third contribution to the solid body of the third model; and
removing the second contribution from the solid body of the third model after adding the third contribution.

24. The method of claim 23, further comprising displaying at least one of the first, second, and third models on a display.

25. The method of claim 19, wherein the CAD system is a history-based CAD system.

26. A method, comprising:
generating a first representation of a mechanical object in a computer aided design (CAD) system, wherein the first representation is an as-designed representation which comprises conceptual geometry of the mechanical object; and automatically generating one or more additional representations of the mechanical object, including an as-cast representation of the mechanical object, using the first representation and one or more modeling parameters, wherein the one or more additional representations comprise geometries that are different than the conceptual geometry of the first representation, and wherein the first representation and the one or more additional representations are part of a single, multi-representational model of the mechanical object.

27. The method of claim 26, further comprising linking the mechanical object of the first representation to the mechanical object of each of the one or more additional representations.

28. The method of claim 26, further comprising storing the first model and the one or more additional representations in a single file as the single, multi-representational model of the mechanical object.

29. The method of claim 28, further comprising displaying one or more of the representations of the single, multi-representational model on a display.

30. An apparatus, comprising:
a computing system with one or more processors; and
a memory storing a program of instructions for:
a modeler to automatically generate a second model of a mechanical object from a first model of the mechanical object using one or more modeling parameters, wherein the first model is an as-designed model that comprises conceptual geometry of the mechanical object, the second model is an as-cast model, and the first and the second models are representative of how the mechanical object changes to accommodate different phases of manufacturing the mechanical object, and
a representation system that represents the first and the second models of the mechanical object as part of a single, multi-representational model of the mechanical object.

31. The apparatus of claim 30, wherein the modeler is configured to automatically generate a third model of the mechanical object using the first model of the mechanical object and one or more modeling parameters, and wherein the first, second, and third models are representative of how the mechanical object changes to accommodate different phases of manufacturing the mechanical object.

32. The apparatus of claim 30, wherein the modeler is configured to automatically generate a third model of the mechanical object using the first and second models of the mechanical object, and wherein the first, second, and third models are representative of how the mechanical object changes to accommodate different phases of manufacturing the mechanical object.

33. The apparatus of claim 30, further comprising:
a parameter controller to identify a plurality of modeling parameters applicable to a current design feature selected by a user for modeling, wherein the plurality of modeling parameters define how the current design feature contributes to each of the first and second models; and
a user interface to:
display a list of design features available for modeling to facilitate a user selection of the current design feature,
display the plurality of modeling parameters applicable to the current design feature in response to the user selection of the current design feature, to facilitate a user selection of one or more modeling parameters from the plurality of modeling parameters, and
receive user input identifying the one or more modeling parameters selected by the user,
wherein the modeler is configured to model the current design feature in the first and second models, in response to the user input, by:
calculating a first geometry of the current design feature for the first model; and
calculating a second geometry of the current design feature for the second model based on the first geometry and one or more modeling parameters selected by the user.

34. The apparatus of claim 33, wherein the user interface is further configured to facilitate user input of one or more geometric parameters pertaining to the current design feature.

35. The apparatus of claim 33, wherein the user interface is further configured to display at least one of the first and second models.

36. The apparatus of claim 30, wherein the modeler is configured to link the mechanical object of the first model to the mechanical object of the second model.

37. The apparatus of claim 36, further comprising a storage device coupled to the modeler to store the first and second models in a single file as the single, multi-representational model of the mechanical object.

38. The apparatus of claim 36, further comprising a display coupled to the modeler to display one or more models of the single-multi-representational model.

39. A computer-readable storage medium having instruction stored thereon which when executed by a computer cause the computer to perform a method, comprising:
generating a first model of a mechanical object in a computer-aided design (CAD) system; and
automatically generating a second model of the mechanical object using the first model and one or more modeling parameters,
wherein the first model is an as-designed model that comprises conceptual geometry of the mechanical object, the second model is an as-cast model, and wherein the first and second models are part of a single, multi-representational model of the mechanical object.

40. The computer-readable storage medium of claim 39, wherein the method further comprises, automatically generating a third model of the mechanical object using the second model and one or more modeling parameters, wherein the third model is an as-machined model.

41. The computer-readable storage medium of claim 39, wherein the first, second, and third models are functional object representations (FOR).

42. The computer-readable storage medium of claim 39, wherein the instructions cause the computer to receive the one or more modeling parameters from a user.

43. The computer-readable storage medium of claim 39, wherein the instructions cause the computer to calculate geometry of the mechanical object in the second model using geometry of the mechanical object in the first model and the one or more modeling parameters.

44. A computer-readable storage medium having instruction stored thereon which when executed by a computer cause the computer to perform a method comprising:
generating a first representation of a mechanical object in a computer aided design (CAD) system, wherein the first representation is an as-designed representation which comprises conceptual geometry of the mechanical object; and
automatically generating one or more additional representations of the mechanical object, including an as-cast representation of the mechanical object, using the first representation and one or more modeling parameters, wherein the one or more additional representations comprise geometries that are different than the conceptual geometry of the first representation, and wherein the first representation and the one or more additional representations are part of a single, multi-representational model of the mechanical object.

* * * * *